(12) United States Patent
Ando

(10) Patent No.: US 8,547,137 B2
(45) Date of Patent: Oct. 1, 2013

(54) INTEGRATED CIRCUIT DEVICE AND DATA TRANSMISSION SYSTEM

(75) Inventor: Naruyoshi Ando, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 317 days.

(21) Appl. No.: 12/795,988

(22) Filed: Jun. 8, 2010

(65) Prior Publication Data
US 2010/0327922 A1 Dec. 30, 2010

(30) Foreign Application Priority Data
Jun. 26, 2009 (JP) ................................. 2009-152672

(51) Int. Cl.
*H03K 19/177* (2006.01)
*H01L 25/00* (2006.01)

(52) U.S. Cl.
USPC ............................................... 326/41; 326/38

(58) Field of Classification Search
None
See application file for complete search history.

(56) References Cited

U.S. PATENT DOCUMENTS

| | | | | |
|---|---|---|---|---|
| 4,906,870 A | * | 3/1990 | Gongwer | 326/45 |
| 5,389,834 A | * | 2/1995 | Kinugasa et al. | 326/21 |
| 5,708,386 A | * | 1/1998 | Chow | 327/380 |
| 5,963,047 A | * | 10/1999 | Kwong et al. | 326/27 |
| 6,172,516 B1 | * | 1/2001 | Han et al. | 326/27 |
| 6,483,340 B2 | | 11/2002 | Uenishi | |
| 6,777,997 B2 | * | 8/2004 | Tahara et al. | 327/333 |

FOREIGN PATENT DOCUMENTS
JP 2002-9605 A 1/2002

* cited by examiner

*Primary Examiner* — Crystal L Hammond
(74) *Attorney, Agent, or Firm* — Arent Fox LLP

(57) ABSTRACT

An integrated circuit device includes: a plurality of I/O cells coupled to an external apparatus; a control signal generator configured to detect a phase relationship among data signals respectively input into the plurality of I/O cells and to generate control signals based on the phase relationship; and a drive controller circuit configured to control the driving of the I/O cells in response to the control signals.

17 Claims, 24 Drawing Sheets

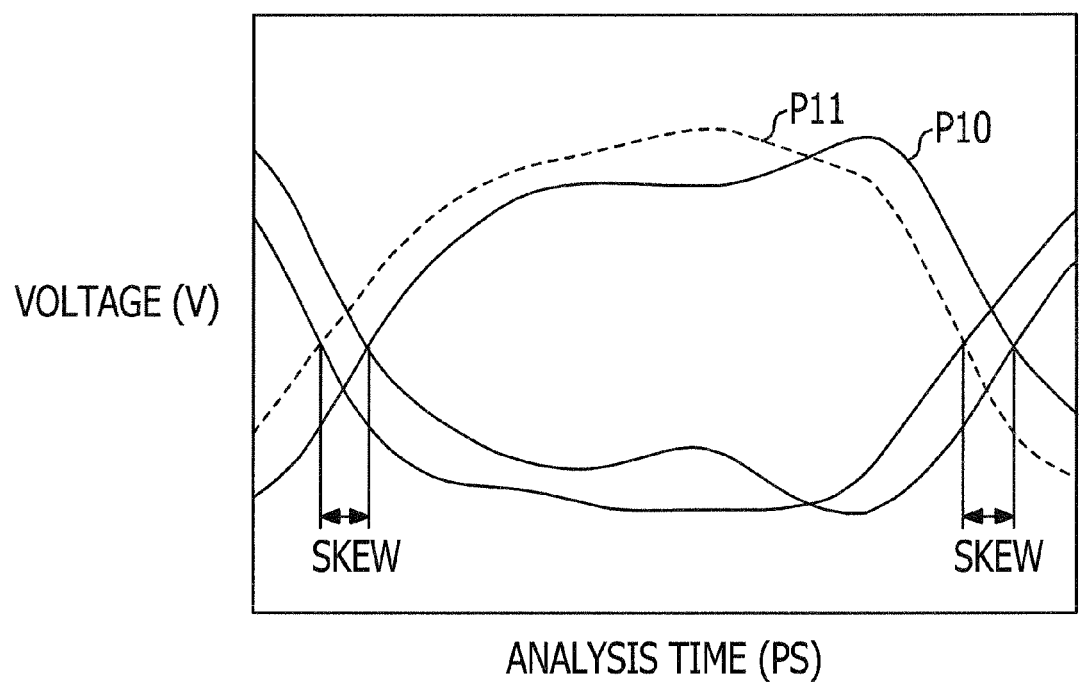

INTEGRATED CIRCUIT DEVICE AND DATA TRANSMISSION SYSTEM

CROSS-REFERENCE TO RELATED APPLICATIONS

This application claims the benefit of priority from Japanese Patent Application No. 2009-152672 filed on Jun. 26, 2009, the entire contents of which are incorporated herein by reference.

BACKGROUND

1. Field

Embodiments discussed herein relate to an integrated circuit device having I/O cells.

2. Description of Related Art

In a memory interface, a signal output from an input/output (I/O) cell as a transmission source propagates through a printed circuit board via package internals, and arrives at a receiving device. For example, in DDR2-800 Mbps data transmission, a timing window between data and a data strobe signal might be 2500 ps/4=625 ps for setup/hold on one side. The timing window may be affected by factors such as simultaneous switching output (SSO) noise in the skew and I/O cells inside the integrated circuit device, waveform disorder due to bonding wires in the package, and crosstalk between adjacent wires.

Related art is disclosed in Japanese Laid-open Patent Publication No. 2002-9605, for example.

SUMMARY

According to one aspect of the embodiments, an integrated circuit device is provided which includes: a plurality of I/O cells coupled to an external apparatus; a control signal generator configured to detect a phase relationship among data signals respectively input into the plurality of I/O cells and to generate control signals based on the phase relationship; and a drive controller circuit configured to control the driving of the I/O cells in response to the control signals.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 3 illustrates an exemplary eye pattern.

DESCRIPTION OF EMBODIMENTS

Figure 1:
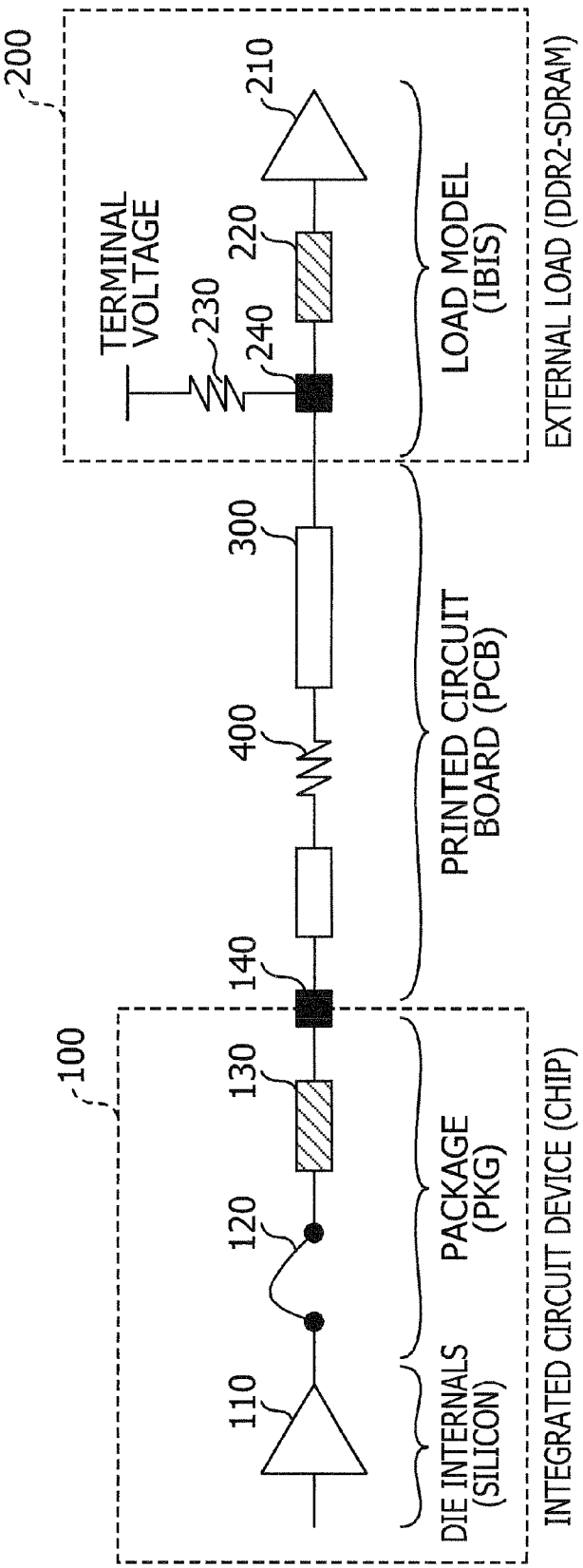
FIG. 1 illustrates an exemplary single transmission.

FIG. 1 illustrates an exemplary single transmission. The integrated circuit device 100 is coupled to the external load 200 via the printed circuit board transmission path 300. The integrated circuit device 100 includes an I/O cell 110 on-die (DIE), while also including a bonding wire 120 and an interposer 130 in a package (PKG). The integrated circuit device 100 is coupled to an external lead 140 coupled to the printed circuit board transmission path 300. The external load 200 may be, for example, DDR2-SDRAM. The external load 200 includes an external lead 240 coupled to the printed circuit board transmission path 300. In the external load 200, the external lead 240 is coupled to the input of the SDRAM 210 via a PKG equivalent circuit 220. The external lead 240 is coupled to a given voltage in the external load 200 via a terminator 230. The printed circuit board transmission path 300 includes a damping resistor 400.

The I/O cell 110 amplifies and buffers the output signal of the integrated circuit device 100. The output signal of the I/O cell 110 is output from the integrated circuit device 100 via the bonding wire 120 and the interposer 130. The output signal reaches the external lead 240 of the external load 200 via the printed circuit board transmission path 300 coupled to the external lead 140.

Figure 2:
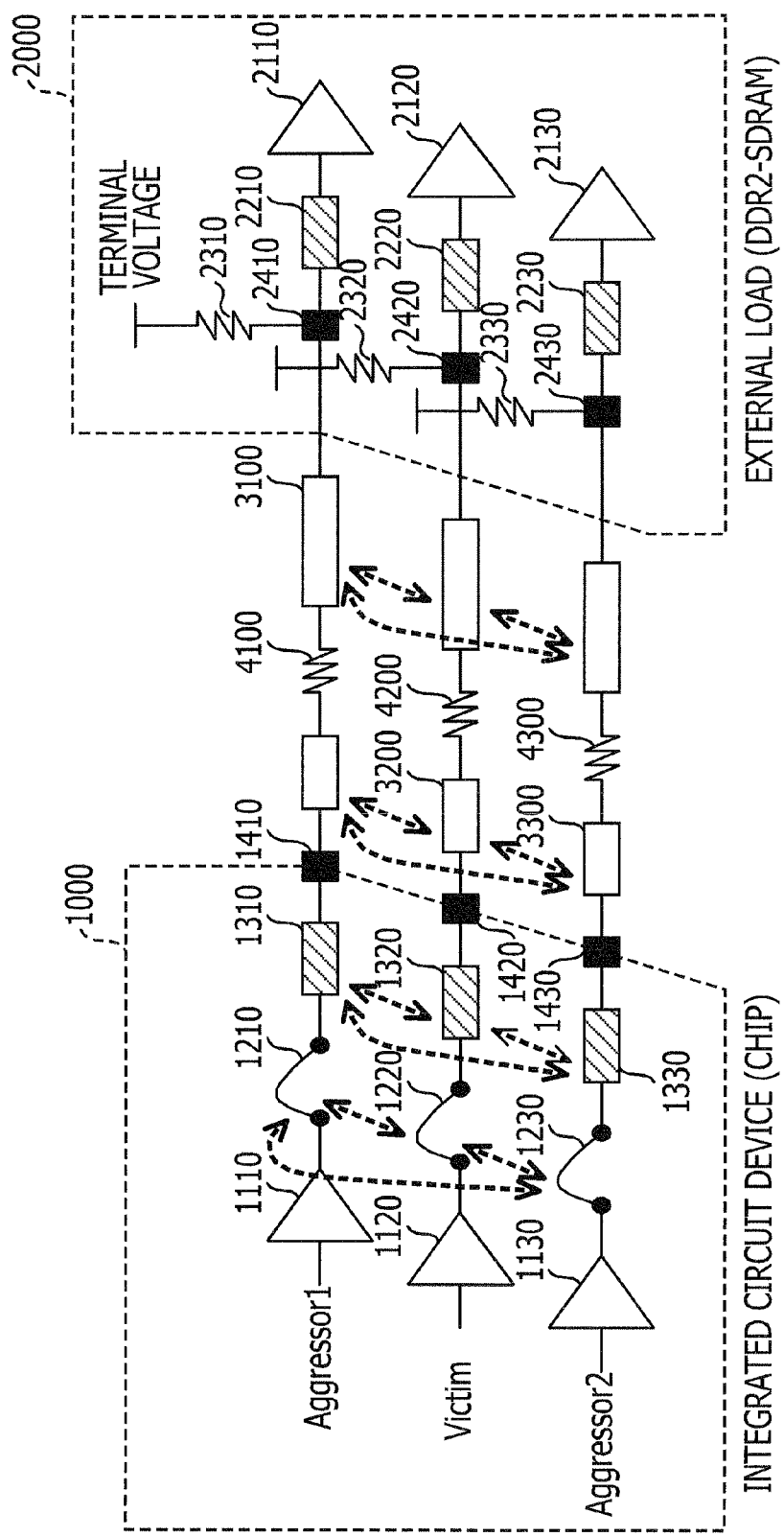
FIG. 2 illustrates an exemplary parallel transmission.

FIG. 2 illustrates an exemplary parallel transmission. The integrated circuit device 1000 is coupled to the external load 2000 via at least three printed circuit board transmission paths 3100 to 3300. The integrated circuit device 1000 includes at least three I/O cells 1110 to 1130 on-die, while also including bonding wires 1210 to 1230 and interposers 1310 to 1330 in a package. The integrated circuit device 1000 included external leads 1410 to 1430 coupled to the printed circuit board transmission paths 3100 to 3300. The external load 2000 may be, for example, DDR2-SDRAM. The external load 2000 includes external leads 2410 to 2430 coupled to the printed circuit board transmission paths 3100 to 3300. In the external load 2000, the external leads 2410 to 2430 are coupled to the inputs of SDRAM 2110 to 2130 via PKG equivalent circuits 2210 to 2230. The external leads 2410 to 2430 are coupled to a given voltage in the external load 2000 via terminators 2310 to 2330. The printed circuit board transmission paths 3100 to 3300 include damping resistors 4100 to 4300.

In parallel transmission, when a signal of the second transmission path in the middle is observed by the external lead 2420 on the load side, crosstalk occurs at the transmission paths provided on both sides of the second transmission path in the package inside the integrated circuit device 1000 as well as in the wires of the printed circuit board, as indicated by the broken arrows in FIG. 2. Such crosstalk includes mutual induction and dielectric coupling. In parallel transmission, the signal propagation delay may increase due to crosstalk.

FIG. 3 illustrates an exemplary eye pattern. The eye pattern illustrated in FIG. 3 may be observed in parallel transmission. For example, in the parallel transmission circuit illustrated in FIG. 2, a signal passing through the second transmission path in the center is observed at the external lead on the load side. When the signals of the first transmission path and the third transmission path provided at both sides of the second transmission path are in phase with the signal of the second transmission path, the first eye pattern P10 indicated by the solid line is observed. When the signals of the first transmission path and the third transmission path provided on the both sides of the second transmission path are in anti-phase with the signal of the second transmission path, the second eye pattern P11 indicated by the broken line is observed. The first eye pattern P10 is delayed compared to the second eye pattern P11. Thus, skew due to the phase relationship among signals in parallel transmission may occur.

Figure 4A:
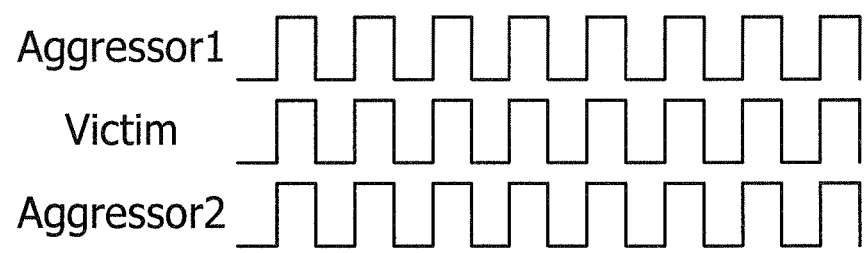
FIGS. 4A and 4B illustrate exemplary phase relationships among transmission paths.
Figure 4B:
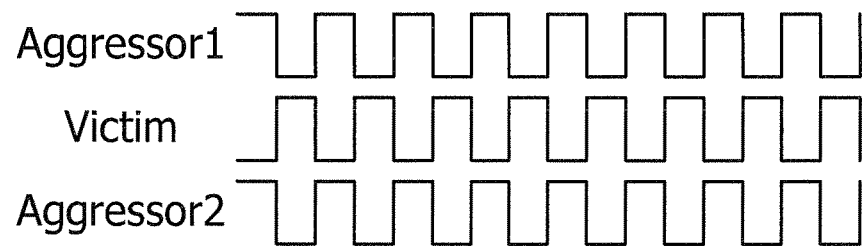

FIGS. 4A and 4B illustrate exemplary phase relationships among transmission paths. The transmission illustrated in FIGS. 4A and 4B may be parallel transmission. In FIG. 4A, the signal in a given transmission path may be substantially in phase with the signals in the adjacent transmission paths. The switching pattern illustrated in FIG. 4A may be referred to as an even pattern, or an in-phase transition. A signal affected by crosstalk from a signal in an adjacent transmission path may be referred to as the victim. A signal that exerts the effects of crosstalk may be referred to as the aggressor. In FIGS. 4A and 4B, the victim signal in a given transmission path is in anti-phase with the aggressor signals in the transmission paths on both sides. The switching pattern illustrated in FIG. 4B may be referred to as an odd pattern, or an anti-phase transition.

For example, in DDR-SDRAM, a data signal and a data strobe signal, which adjust timing for sending and receiving, may be out of phase by one-fourth of a cycle. For this reason, a crosspoint of the data strobe signal is established near the center of the eye pattern of the data signal. A crosspoint refers to a positive or negative node of a differential signal.

Figure 5:
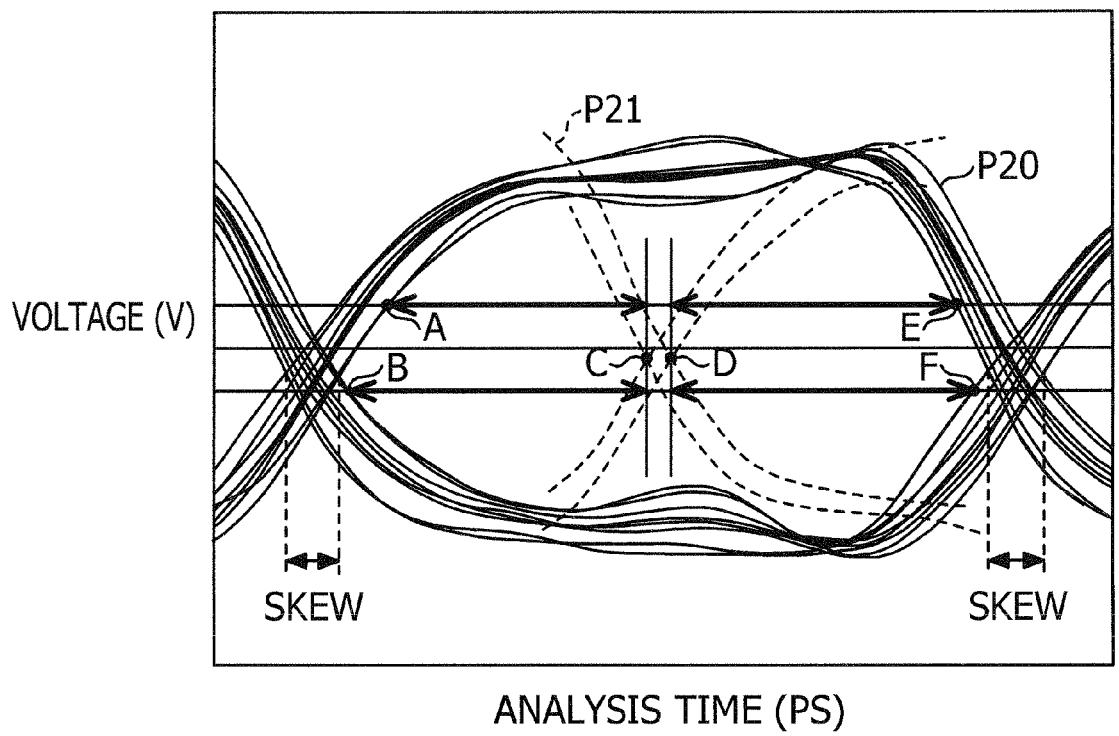
FIG. 5 illustrates an exemplary eye pattern.

FIG. 5 illustrates an exemplary eye pattern. The eye pattern illustrated in FIG. 5 may be a superposition of data signal waveforms and data strobe signal waveforms in DDR-SDRAM. The first eye pattern P20 indicated by the solid lines corresponds to the waveforms of the data signal. The second eye pattern P21, whose crosspoints are indicated by the broken lines, corresponds to the waveforms of the data strobe signal. Skews may occur in the eye patterns of the data signal and the data strobe signal.

Regarding a setup, the timing extending from the earliest point C among the crosspoints of the data strobe signal to the points A and B on the inner side of the data signal eye pattern corresponds to the worst case. Regarding a hold, the timing extending from the latest point D among the crosspoints of the data strobe signal to the points E and F on the inner side of the data signal eye pattern corresponds to the worst case. The points A and E are the points where the data signal takes a High threshold value as determined by the specifications of the load, such as SDRAM. The points B and F are the points where the data signal takes a Low threshold value as determined by the specifications of the load.

As skews increase the opening of the eye pattern narrows, and the points A, B, E, and F may become positioned farther inward. For this reason, the setup and hold margin may become smaller.

Figure 6:
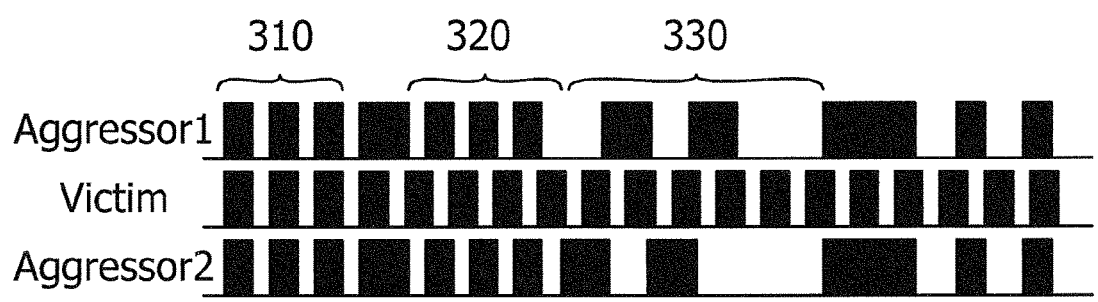
FIG. 6 illustrates exemplary input signal patterns.

FIG. 6 illustrates exemplary input signal patterns. The input signal patterns illustrated in FIG. 6 may be used for evaluation of signal eye patterns by simulation. The simulation may predict the shape of the eye pattern based on combinations of the following three types of patterns. The first pattern is the pattern sequence 310 illustrated in FIG. 6 where 0/1 transitions in the victim signal and the aggressor signals are regularly toggled at maximum frequency. The second pattern is the pattern sequence 320 illustrated in FIG. 6 where 0/1 transitions in the aggressor signals occur in anti-phase to 0/1 transitions in the victim signal, and are regularly toggled at maximum frequency. The third pattern is the pattern sequence 330 illustrated in FIG. 6 where the aggressor signals infrequently toggle from a Low level or a High level while the victim signal is in the middle of a 0/1 transition.

FIGS. 7A to 7H illustrate exemplary equivalent circuits for parallel transmission paths. The transmission paths illustrated in FIGS. 7A to 7H may be parallel transmission paths. In parallel transmission paths including a second transmission path of a victim signal as well as first and third transmission paths provided on both sides of the second transmission path, eight types of transmission modes based on combinations of even and odd patterns may exist.

Figure 7A:
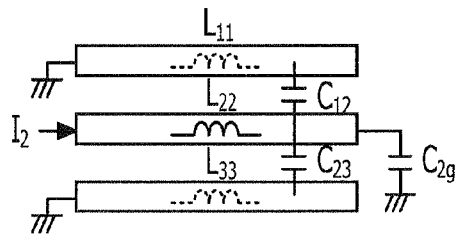
FIGS. 7A to 7H illustrate exemplary equivalent circuits for parallel transmission paths.

In the equivalent circuit illustrated in FIG. 7A, the victim signal in the second transmission path is active, and the signals in the first and the third transmission paths are set to given potentials. FIG. 7A may be referred to as a victim-only. In the victim-only mode, a current I2 may flow through the second transmission path, and current may not flow through the first and the third transmission paths. The self-inductances L11 and L33 in the first and the third transmission paths may be ignored. One end of the second transmission path is terminated by a capacitor C2g, and the potential between both ends of the capacitor may be V2. The potential V2 and the current I2 are expressed as $$V2 = L22 \times (dI2/dt)$$

$$I2 = (C2g + C12 + C23) \times (dV2/dt)$$

C12 indicates a parasitic capacitance between the first transmission path and the second transmission path, and C23 indicates a parasitic capacitance between the second transmission path and the third transmission path. The equivalent impedance Z2 of the second transmission path is expressed as $$Z2 = V2/I2 = \sqrt{\{L22/(C2g + C12 + C23)\}}$$

The propagation delay T2 in the victim-only mode is expressed as $$T2 = \sqrt{\{L22 \times (C2g + C12 + C23)\}}$$

Figure 7B:
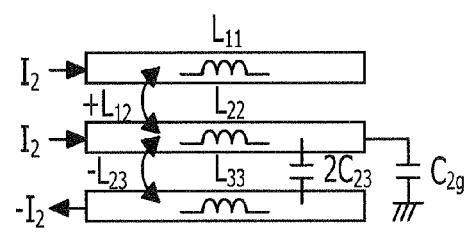

In the equivalent circuit illustrated in FIG. 7B, the signals in the parallel transmission paths are active, and the aggressor signal in the first transmission path or the third transmission path is in anti-phase. FIG. 7B may be referred to as an odd-even mode. Since the signals in the first transmission path and the second transmission path are in phase, current I2 flows in substantially the same direction. Since the aggressor signal in the third transmission path is in anti-phase with the victim signal in the second transmission path, current −I2 flows in the opposite direction. In the odd-even mode, the potential V2 and the current I2 are expressed as $$V2 = (L22 + L12 - L23) \times (dI2/dt)$$

$$I2 = (C2g + 2C23) \times (dV2/dt)$$

L12 indicates the mutual inductance between the first transmission path and the second transmission path, and L23 indicates the mutual inductance between the second transmission path and the third transmission path. Parallel transmission paths may have a symmetrical layout, and L12 may equal to L23. The equivalent impedance ZODD_EVEN of the second transmission path is expressed as $$ZODD\_EVEN=\sqrt{\{L22/(C2g+2C23)\}}=Z2$$

The propagation delay TODD_EVEN in odd-even is expressed as $$TODD\_EVEN=\sqrt{\{L22\times(C2g+2C23)\}}=T2$$

When the parallel transmission paths have a symmetrical layout, the equivalent impedance ZODD_EVEN and the propagation delay TODD_EVEN in the odd-even mode may be substantially equal to the equivalent impedance Z2 and the propagation delay T2 in the victim-only mode. The mutual inductances L12 and L23 may cancel each other out.

Figure 7C:
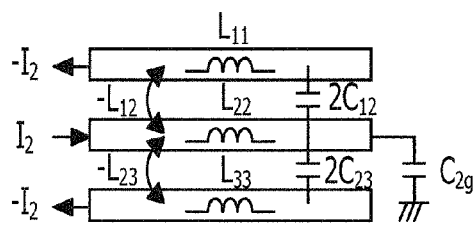

In the equivalent circuit illustrated in FIG. 7C, the signals in the parallel transmission paths are active, and the aggressor signals in the first transmission path and the third transmission path are in anti-phase. FIG. 7C may be referred to as an odd mode. Current I2 flows through the second transmission path of the victim signal. Since aggressor signals, which are in anti-phase with the victim signal in the second transmission path, are transmitted in the first transmission path and the third transmission path, current −I2 flows in the opposite direction. In the odd mode, the potential V2 and the current I2 are expressed as $$V2=(L22-L12-L23)\times(dI2/dt)$$

$$I2=(C2g+2C12+2C23)\times(dV2/dt)$$

Consequently, the equivalent impedance ZODD of the second transmission path is expressed as $$ZODD=\sqrt{\{(L22-L12-L23)/(C2g+2C12+2C23)\}}$$

In the equivalent impedance ZODD of the second transmission path, the inductance component becomes smaller than that of the equivalent impedance Z2 in the victim-only mode by subtracting the mutual inductance components L12 and L23 from the self-inductance component L22. Meanwhile, the capacitance component becomes larger than that of the equivalent impedance Z2 in the victim-only mode by the adjacent capacitors C12 and C23 being mirror-coupled to the termination capacitor C2g. The equivalent impedance ZODD of the second transmission path is smaller than the equivalent impedance Z2 in the victim-only mode. The propagation delay TODD in the odd mode is expressed as $$TODD=\sqrt{\{(L22-L12-L23)\times(C2g+2C12+2C23)\}}$$

Figure 7D:
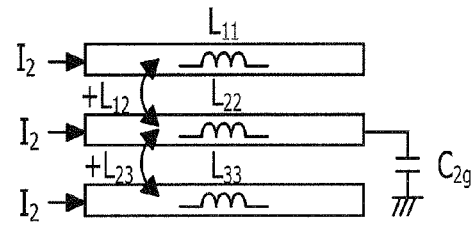

In the equivalent circuit illustrated in FIG. 7D, the signals in the parallel transmission paths are active and in phase. FIG. 7D may be referred to as an even mode. Current I2 flows through the second transmission path of the victim signal, as well as through the first transmission path and the third transmission path. In the even mode, the potential V2 and the current I2 are expressed as $$V2=(L22+L12+L23)\times(dI2/dt)$$

$$I2=C2g\times(dV2/dt)$$

The equivalent impedance ZEVEN of the second transmission path is expressed as $$ZEVEN=\sqrt{\{(L22+L12+L23)/C2g\}}$$

In the equivalent impedance ZEVEN of the second transmission path, the inductance component becomes larger than that of the equivalent impedance Z2 in the victim-only mode by adding the mutual inductance components L12 and L23 to the self-inductance component L22 and the capacitance component is smaller than that of the equivalent impedance Z2 in the victim-only mode due to the presence of just the termination capacitor C2g. The equivalent impedance ZEVEN of the second transmission path is larger than the equivalent impedance Z2 in the victim-only mode. The propagation delay TEVEN in the even mode is expressed as $$TEVEN=\sqrt{\{(L22+L12+L23)\times C2g\}}$$

Figure 7E:
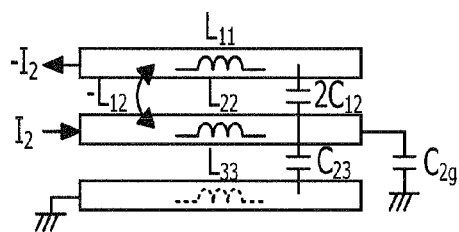

In the equivalent circuit illustrated in FIG. 7E, an aggressor signal, which is in anti-phase with the victim signal in the second transmission path, is transmitted via the first transmission path. FIG. 7E may be referred to as a 1-2 odd mode. Since the aggressor signal in the first transmission path is in anti-phase with the victim signal in the second transmission path, current −I2 flows in the first transmission path in the direction opposite to that of the current in the second transmission path. In the 1-2 odd mode, the potential V2 and the current I2 are expressed as $$V2=(L22-L12)\times(dI2/dt)$$

$$I2=(C2g+2C12+C23)\times(dV2/dt)$$

The equivalent impedance Z12ODD of the second transmission path is expressed as $$Z12ODD=\sqrt{\{(L22-L12)/(C2g+2C12+C23)\}}$$

The equivalent impedance Z12ODD is larger than the equivalent impedance ZODD in the odd mode, and smaller than the equivalent impedance Z2 in the victim-only mode. The propagation delay T12ODD in the 1-2 odd mode is expressed as $$T12ODD=\sqrt{\{(L22-L12)\times(C2g+2C12+C23)\}}$$

Figure 7F:
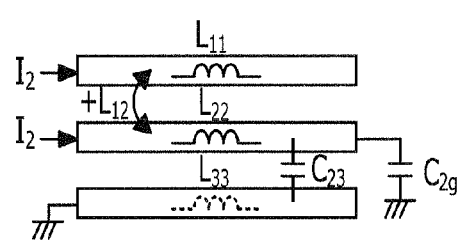

In the equivalent circuit illustrated in FIG. 7F, the victim signal in the second transmission path and the aggressor signal in the first transmission path are in phase. FIG. 7F may be referred to as a 1-2 even mode. Since the aggressor signal in the first transmission path is in phase with the victim signal in the second transmission path, current I2 flows in the first transmission path substantially in the same direction as that of the current in the second transmission path. In the 1-2 even mode, the potential V2 and the current I2 are expressed as $$V2=(L22+L12)\times(dI2/dt)$$

$$I2=(C2g+C23)\times(dV2/dt)$$

The equivalent impedance Z12EVEN of the second transmission path is expressed as $$Z12EVEN=\sqrt{\{(L22+L12)/(C2g+C23)\}}$$

The equivalent impedance Z12EVEN is smaller than the equivalent impedance ZEVEN in the even mode, and larger than the equivalent impedance Z2 in the victim-only mode. The propagation delay T12EVEN in the 1-2 even mode is expressed as $$T12EVEN=\sqrt{\{(L22+L12)\times(C2g+C23)\}}$$

Figure 7G:
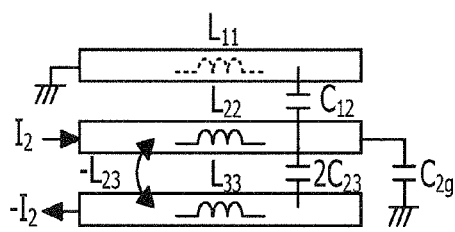

In the equivalent circuit illustrated in FIG. 7G, the victim signal in the second transmission path is in anti-phase with the aggressor signal in the third transmission path. FIG. 7G may be referred to as a 2-3 odd mode. Since the aggressor signal in the third transmission path is in anti-phase with the victim signal in the second transmission path, current −I2 flows in the third transmission path in the direction opposite to that of the current in the second transmission path. In the 2-3 odd mode, the potential V2 and the current I2 are expressed as $$V2=(L22-L23)\times(dI2/dt)$$

$$I2=(C2g+C12+2C23)\times(dV2/dt)$$

The equivalent impedance Z23ODD of the second transmission path is expressed as $$Z23ODD=\sqrt{\{(L22-L23)/(C2g+C12+2C23)\}}$$

The equivalent impedance Z23ODD is larger than the equivalent impedance ZODD in the odd mode, and smaller than the equivalent impedance Z2 in the victim-only mode. The propagation delay T23ODD in the 2-3 odd mode is expressed as $$T23ODD=\sqrt{\{(L22-L23)\times(C2g+C12+2C23)\}}$$

When the parallel transmission paths have a symmetrical layout, the equivalent impedance Z23ODD and the propagation delay T23ODD in the 2-3 odd mode may become substantially equal to the equivalent impedance Z12ODD and the propagation delay T12ODD in the 1-2 odd mode.

Figure 7H:
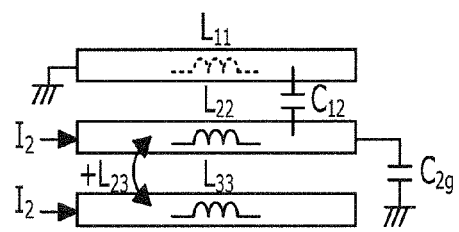

In the equivalent circuit illustrated in FIG. 7H, the victim signal in the second transmission path and the aggressor signal in the third transmission path are in phase. FIG. 7H may be referred to as a 2-3 even mode. Since the aggressor signal in the third transmission path is in phase with the victim signal in the second transmission path, current I2 flows in the third transmission path in substantially the same direction as that of the current in the second transmission path. In the 2-3 even mode, the potential V2 and the current I2 are expressed as $$V2=(L22+L23)\times(dI2/dt)$$

$$I2=(C2g+C12)\times(dV2/dt)$$

The equivalent impedance Z23EVEN of the second transmission path is expressed as $$Z23EVEN=\sqrt{\{(L22+L23)/(C2g+C12)\}}$$

The equivalent impedance Z23EVEN is smaller than the equivalent impedance ZEVEN in the even mode, and larger than the equivalent impedance Z2 in the victim-only mode. The propagation delay T23EVEN in the 2-3 even mode is expressed as $$T23EVEN=\sqrt{\{(L22+L23)\times(C2g+C12)\}}$$

When the parallel transmission paths have a symmetrical layout, the equivalent impedance Z23EVEN and the propagation delay T23EVEN in the 2-3 even mode may become substantially equal to the equivalent impedance Z12EVEN and the propagation delay T12EVEN in the 1-2 even mode.

The relationships among the equivalent impedances in the respective transmission modes are thus expressed as $$ZEVEN>T12EVEN=T23EVEN>Z2>Z12ODD=Z23ODD>ZODD$$

Figure 8:
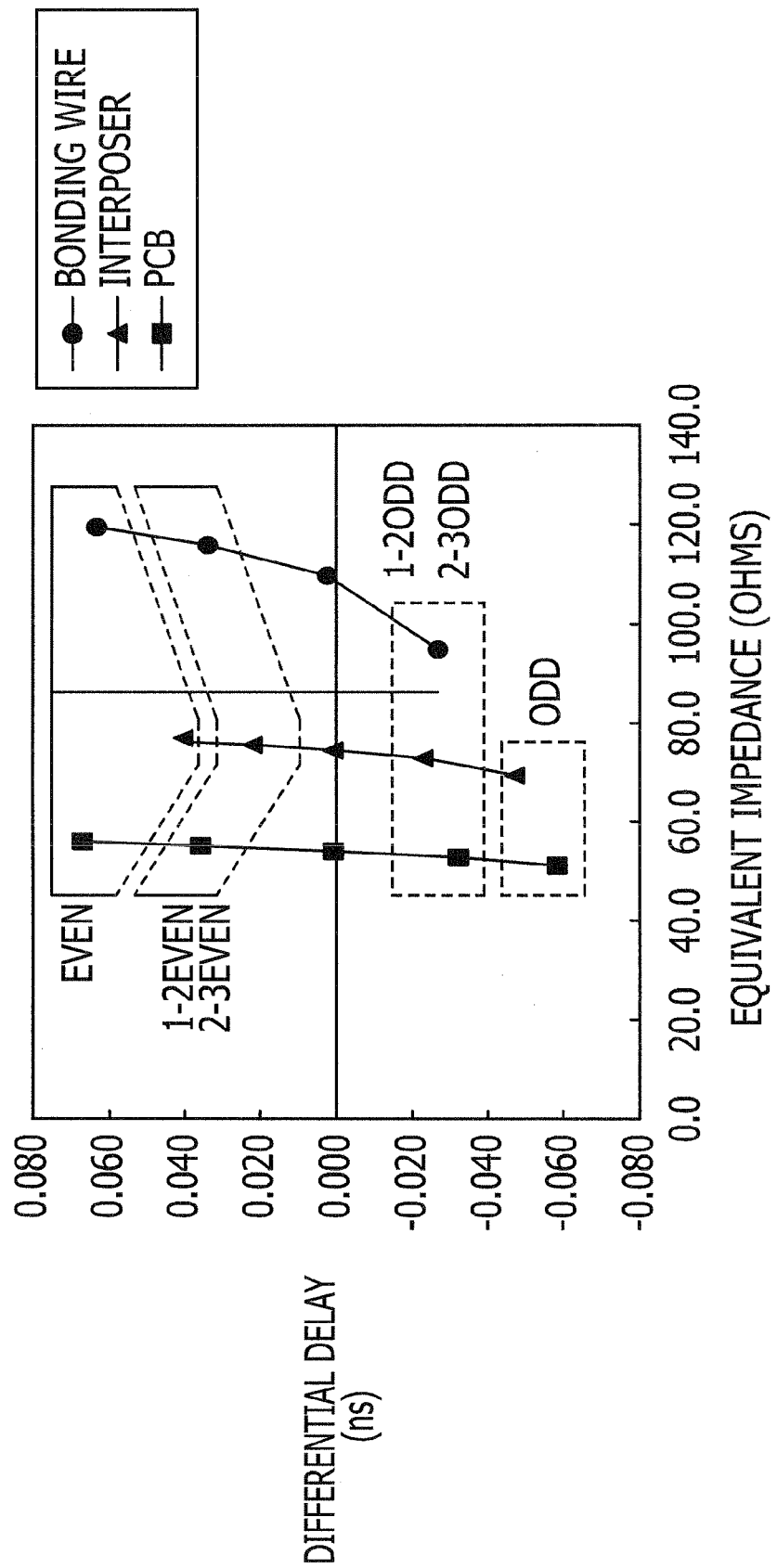
FIG. 8 illustrates exemplary relationships between the equivalent impedance and the propagation delay.

FIG. 8 illustrates exemplary relationships between an equivalent impedance and a propagation delay. The relationships illustrated in FIG. 8 may be calculated by simulation using the previous formulas for equivalent impedance and propagation delay. The horizontal axis indicates the equivalent impedance (in units of ohms ($\Omega$)). The vertical axis indicates the differential delay with respect to the propagation delay T2=0 in the victim-only mode (in units of nanoseconds (ns)). A negative differential delay indicates that the propagation delay is faster (i.e., less) than the propagation delay T2 in the victim-only mode that is herein used as a reference. Likewise, a positive differential delay indicates that the propagation delay is slower (i.e., greater) than the propagation delay T2 in the victim-only mode that is herein used as a reference.

In all of the transmission modes, the equivalent impedance increases in the printed circuit board, the interposer, and the bonding wires, in that order. The differential equivalent impedance between transmission modes increases in the printed circuit board, the interposer, and the bonding wires, in that order. The pitch of the interposer is narrow compared to the printed circuit board, and thus the mutual inductance is large. The distance to the return surface of the bonding wires is greater compared to the interposer, and thus the mutual inductance is large. The relationships among the propagation delays of the respective transmission modes are thus expressed as $$TEVEN>T12EVEN=T23EVEN>T2>T12ODD=T23ODD>TODD$$

In FIG. 8, the propagation delay is illustrated as relative values with respect to the propagation delay T2 in the victim-only mode, such as the differential delay. Differential propagation delays between the even and odd modes are as follows for the package bonding wires, interposer, and printed circuit board.

Bonding wires: 20 ps/mm
Interposer: 5 ps/mm
Printed circuit board: 2 ps/mm

A differential propagation delay per unit length of the bonding wires between the even and odd modes may be large. Crosstalk effects may be compensated for in the even mode where the propagation delay is large.

Figure 9:
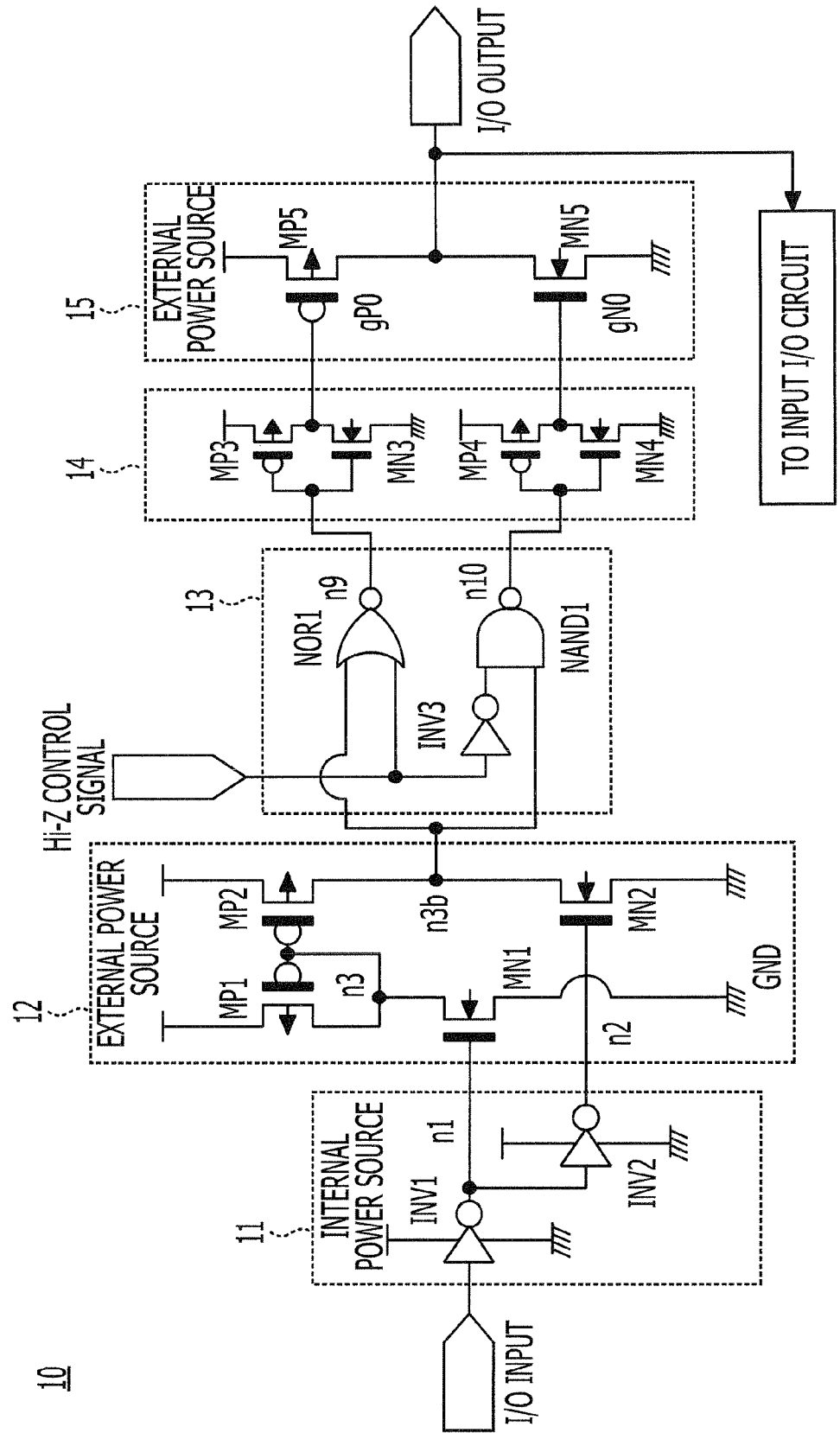
FIG. 9 illustrates an exemplary I/O cell.

FIG. 9 illustrates an exemplary I/O cell. The I/O cell 10 includes an internal circuit 11, a level converter 12, a high-impedance control circuit 13, a pre-buffer 14, and a final buffer 15.

The internal circuit 11 outputs a signal for operating the level converter 12 based on an input signal. The internal circuit 11 includes first and second inverters INV1 and INV2. The first inverter INV1 inverts the input signal, and supplies the inverted signal n1 to the level converter 12. The second inverter INV2 inverts the input signal n1 that was inverted by the first inverter INV1, and supplies the inverted signal n2 to the level converter 12.

The level converter 12 may be a differential amplifier circuit that amplifies an input signal. The level converter 12 includes first and second PMOS transistors MP1 and MP2, and first and second NMOS transistors MN1 and MN2. The source terminals of the first and second PMOS transistors MP1 and MP2 are coupled to an external power source that supplies a giver voltage. The gate terminals of the first and second PMOS transistors MP1 and MP2 are coupled to each other. The drain terminal of the first PMOS transistor MP1 is coupled to both the gate terminal of the second PMOS transistor MP2 and the drain terminal of the first NMOS transistor MN1. The drain terminal of the second PMOS transistor MP2 is coupled to the drain terminal of the second NMOS transistor MN2. The first NMOS transistor MN1 includes a grounded source terminal, as well as a gate terminal coupled to the output of the first inverter INV1 in the internal circuit 11. The second NMOS transistor MN2 includes a grounded source terminal, as well as a gate terminal coupled to the output of the second inverter INV2 in the internal circuit 11.

The high-impedance control circuit 13 will make the output of the I/O cell to high impedance. The high-impedance control circuit 13 includes a third inverter INV3, a NOR circuit NOR1, and a NAND circuit NAND1. The output of the level converter 12 and a high-impedance control signal are supplied to the NOR circuit NOR1 are. The output of the level converter 12 and a high-impedance control signal inverted by the third inverter INV3 are supplied to the NAND circuit NAND1. The output of the level converter 12 is retrieved from the connection point between the second PMOS transistor MP2 and the second NMOS transistor MN2. The high-impedance control signal may be supplied from a controller (not shown) in the integrated circuit device, for example.

The pre-buffer 14 and the final buffer 15 buffer the output of the I/O cell in stages.

The pre-buffer 14 includes third and fourth PMOS transistors MP3 and MP4, and third and fourth NMOS transistors MN3 and MN4. The third PMOS transistor MP3 and the third NMOS transistor MN3 may also include inverter circuits, and their gates are coupled to the output of the NOR circuit NOR1 in the high-impedance control circuit 13. The fourth PMOS transistor MP4 and the fourth NMOS transistor MN4 may also include inverter circuits, and their gates are coupled to the output of the NAND circuit NAND1 in the high-impedance control circuit 13.

The final buffer 15 includes a fifth PMOS transistor MP5 and a fifth NMOS transistor MN5. The PMOS transistor MP5 includes a source terminal coupled to an external power source, a drain terminal coupled to the drain terminal of the fifth NMOS transistor MN5, and a gate terminal coupled to the first output of the pre-buffer 14. The first output of the pre-buffer 14 is retrieved from the coupled point between the third PMOS transistor MP3 and the third NMOS transistor MN3. The fifth NMOS transistor MN5 includes a grounded source terminal, and a gate terminal coupled to the second output of the pre-buffer 14. The second output of the pre-buffer 14 is retrieved from the connection point between the fourth PMOS transistor MP4 and the fourth NMOS transistor MN4.

When the input signal is Low, the internal circuit 11 outputs signals n1 at a high level and n2 at a low level. Since n1 is at the high level, the first NMOS transistor MN1 of the level converter 12 is switched on. Since n2 is at the low level, the second NMOS transistor MN2 of the level converter 12 is switched off. When the first NMOS transistor MN1 is switched on, the drain terminal of the first PMOS transistor MP1 is coupled to the ground, and both the first PMOS transistor MP1, as well as the second PMOS transistor MP2, are switched on. The level converter 12 outputs a high signal that corresponds to the external power source potential.

Since the output of the I/O cell is not set to high impedance, the high-impedance control signal may be at a low level. In the high-impedance control circuit 13, the output of the NOR circuit NOR1 is at a low level, and the output of the NAND circuit NAND1 is at a low level. The first output and the second output of the pre-buffer 14 go to a high level. Since the fifth NMOS transistor MN5 is switched on, the final buffer 15 outputs a low signal that corresponds to the ground potential.

When the input signal is at a high level, the internal circuit 11 outputs the two signals n1 at the low level and n2 at the high level. Since n1 is the low level, the first NMOS transistor MN1 of the level converter 12 is switched off. Since n2 is at the high level, the second NMOS transistor MN2 of the level converter 12 is switched on. Since the first NMOS transistor MN1 is switched off, the potential at the drain terminal of the first PMOS transistor rises to the external power source potential, and both the first PMOS transistor MP1, as well as the second PMOS transistor MP2, are switched off. Since the second NMOS transistor MN2 is switched on, the level converter 12 outputs a Low signal that corresponds to the ground potential.

Since the high-impedance control signal is at a low level, the output of the NOR circuit NOR1 in the high-impedance control circuit 13 is at a high level, and the output of the NAND circuit NAND1 is at a high level. The first output and the second output of the pre-buffer 14 go to a low level. Since the fifth PMOS transistor MP5 is switched on, the final buffer 15 outputs a High signal that corresponds to the external power source potential.

In the I/O cell 10, the amplitude level of the input signal may rise from the internal voltage to the external power source voltage.

Figure 10:
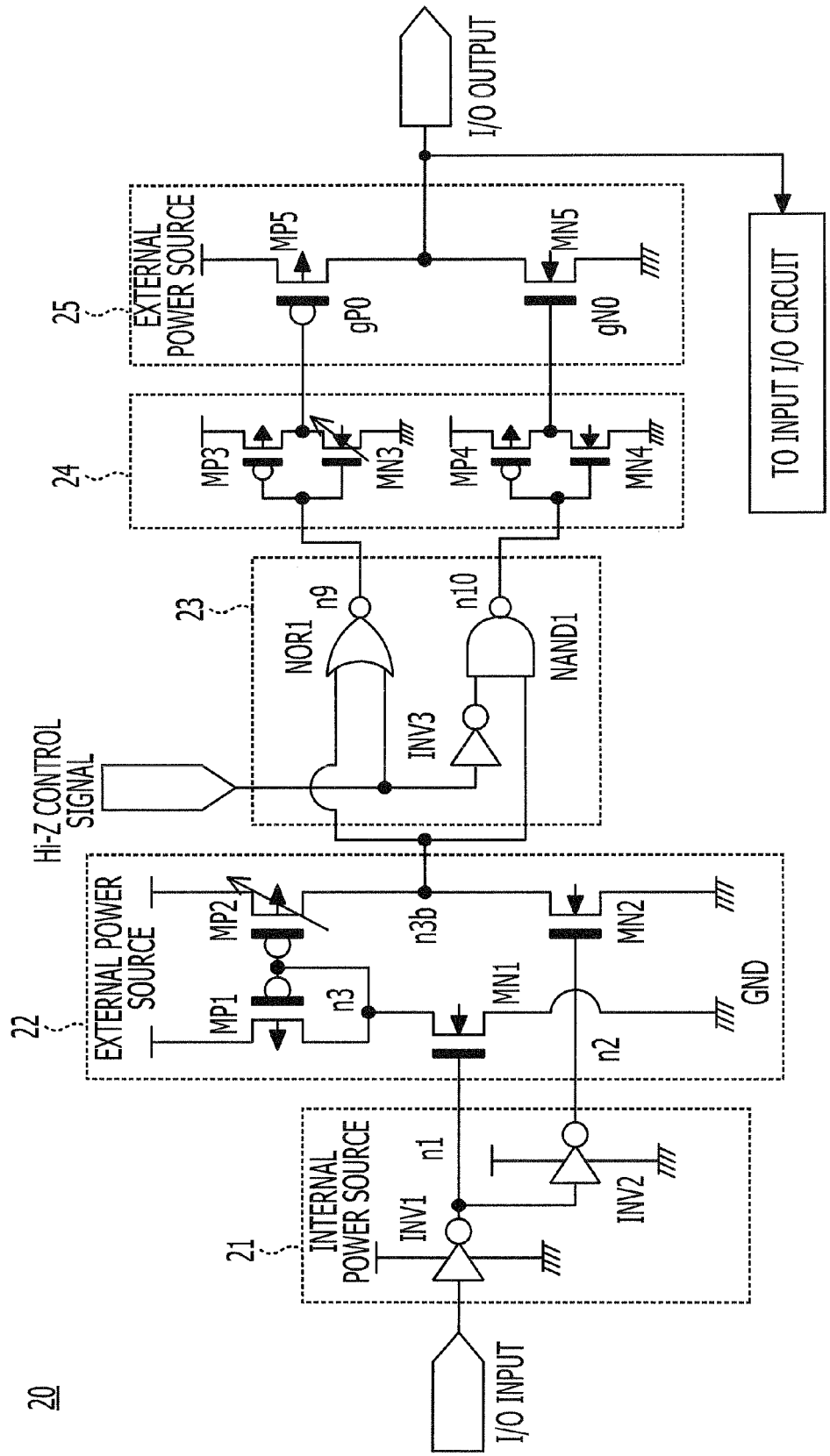
FIG. 10 illustrates an exemplary I/O cell.

FIG. 10 illustrates an exemplary I/O cell. The I/O cell 20 includes an internal circuit 21, a level converter 22, a high-impedance control circuit 23, a pre-buffer 24, and a final buffer 25. In the I/O cell 20, the gate widths of the second PMOS transistor MP2 included in the level converter 22 and the third NMOS transistor MN3 included in the pre-buffer 24 may be variable. The gate width of the fourth PMOS transistor MP4 included in the pre-buffer 24 may not be variable. Since the driving performance of the PMOS transistors is smaller compared to that of the NMOS transistors, the driving performance of the third NMOS transistor MN3 of the pre-buffer 24, which is coupled to the fifth PMOS transistor MP5 of the final buffer 25, may be large. When the driving performance of the fifth NMOS transistor MN5 in the final buffer 25 is small, the driving performance of the pre-buffer transistors may be large. The driving performance may be improved and the switching speed may become faster due to an increase of the widths the transistors.

Figure 11:
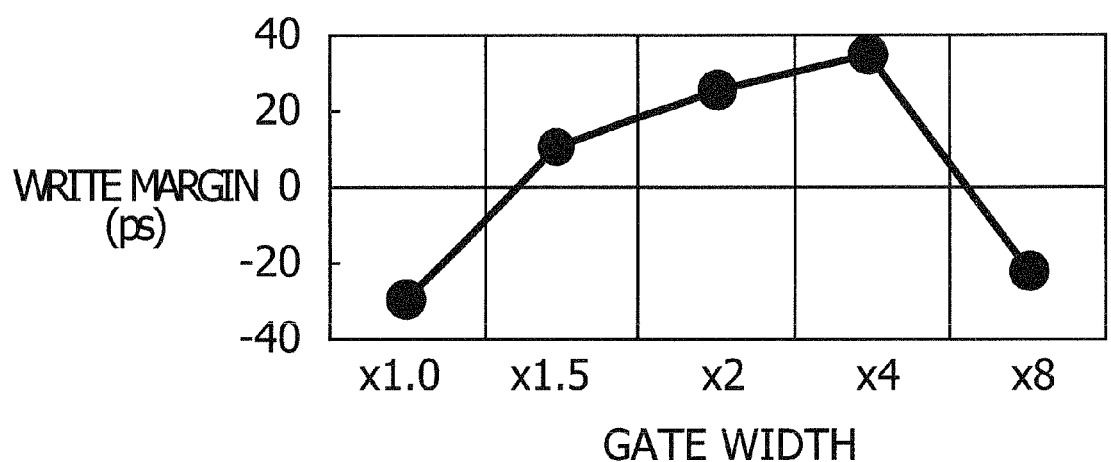
FIG. 11 illustrates an exemplary relationship between a transistor gate width and an AC margin on a write side.

In the even mode where the propagation delay is increased, the propagation delay due to crosstalk by increasing the driving performance of the I/O cell may be compensated. FIG. 11 illustrates an exemplary relationship between a transistor gate width and an AC margin on a write side. The transistor illustrated in FIG. 11 may be included in a DDR2-800 Mbps circuit.

The horizontal axis in FIG. 11 indicates variation in the gate widths of the third NMOS transistor MN3 and the second PMOS transistor MP2. The vertical axis indicates the write margin (in units of picoseconds (ps)). The variation in the gate widths of the transistors MN3 and MP2 may be illustrated by change multipliers, using the gate width of a transistor in the I/O cell 10 illustrated in FIG. 9 as a reference (×1.0). Once the gate width becomes four times (×4), the margin may increase. The propagation delay may thus be improved by adjusting the gate widths of the two transistors included in the pre-buffer 24 and the level converter 22.

Figure 12:
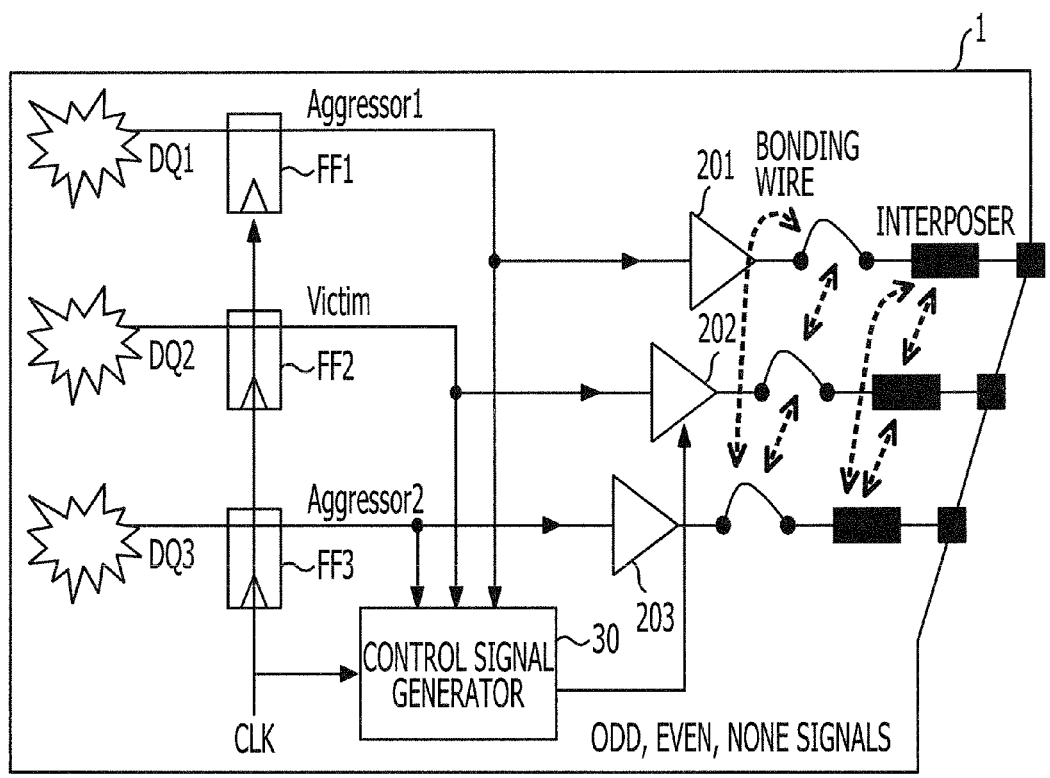
FIG. 12 illustrates an exemplary interface.

FIG. 12 illustrates an exemplary interface. The interface illustrated in FIG. 12 may be provided with respect to the integrated circuit device 1. The integrated circuit device 1 includes I/O cells 201, 202, and 203, which are provided for each transmission path, and a control signal generator 30. The I/O cells 201, 202, and 203 respectively receive the data signals DQ1, DQ2, and DQ3, which are output via the final flip-flops FF1, FF2, and FF3 in a parallel interface in the integrated circuit device 1. The data signals DQ1, DQ2, and DQ3 are input into the control signal generator 30. The control signal generator 30 is supplied with a common clock signal CLK synchronized with the flip-flops FF1, FF2, and FF3. The clock signal CLK may be supplied from a controller (not shown) in the integrated circuit device 1, for example. The control signal generator 30 detects the phase relationship among the data signals DQ1, DQ2, and DQ3, for example, detects the transmission mode, and generates the control signals CONODD, CONEVEN, AND CONNONE based on the detected phase relationship. The control signals CONODD, CONEVEN, and CONNONE are supplied to the victim signal, such as the I/O cell 202 that corresponds to the data signal DQ2. The I/O cell 202 adjusts the transistor gate widths based on the control signals CONODD, CONEVEN, and CONNONE supplied from the control signal generator 30.

The control signal generator 30 includes a victim signal transmission path, and aggressor signal transmission paths on a side thereof. For example, when the integrated circuit device 1 outputs 8-bit data, six control signal generators 30 may be provided. When the integrated circuit device outputs 16-bit data, 14 control signal generators 30 may be provided.

Figure 13:
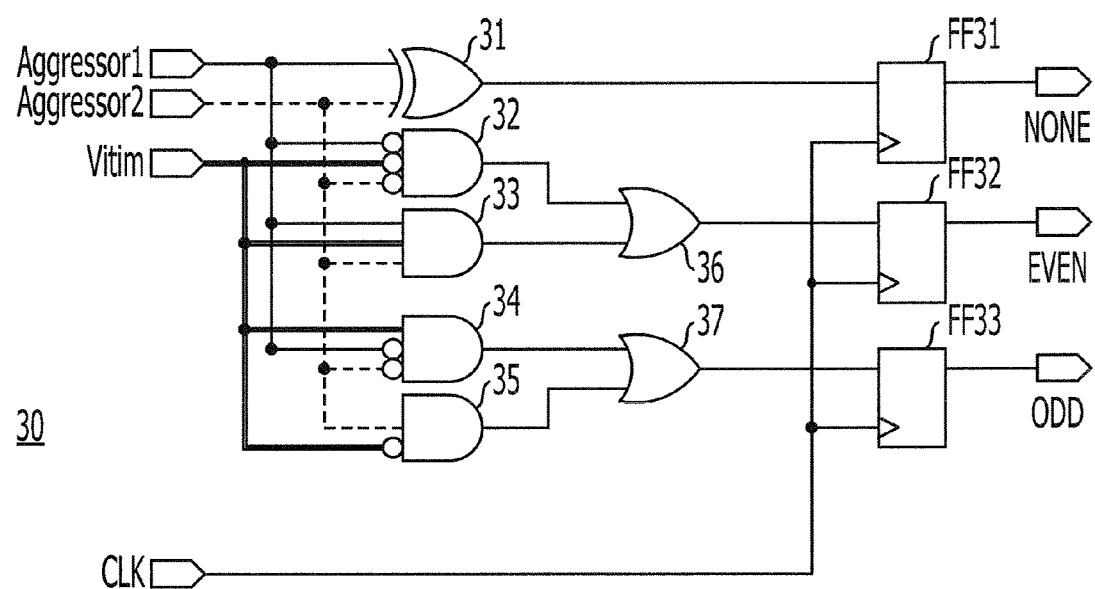
FIG. 13 illustrates an exemplary control signal generator.

FIG. 13 illustrates an exemplary control signal generator. The control signal generator 30 includes an XOR circuit 31, first, second, third, and fourth AND circuits 32 to 35, first and second OR circuits 36 and 37, and flip-flops FF31 to FF33.

The XOR circuit 31 receives the aggressor signals, and outputs a high signal when the aggressor signals are in respectively different states. The output of the XOR circuit 31 is supplied to the first flip-flop FF31, latched by the first flip-flop FF31, and output as the control signal CONNONE.

The first AND circuit 32 receives an inverted victim signal and inverted aggressor signals. The first AND circuit 32 may also perform substantially the same operation as a NOR circuit. The first AND circuit 32 outputs a high signal when the victim signal and the aggressor signals are at a low level.

The second AND signal 33 outputs a high signal when the victim signal and the aggressor signals are at a high level.

The outputs of the first AND circuit 32 and the second AND circuit 33 are input to the first OR circuit 36. The first OR circuit 36 may output a high signal when at least one of the outputs of the first AND circuit 32 and the second AND circuit 33 is at a high level. When the two aggressor signals are in phase with the victim signal, the first OR circuit 36 detects the even mode. The output of the first OR circuit 36 is supplied to the second flip-flop FF32, latched by the second flip-flop FF32, and output as the control signal CONEVEN.

The third AND circuit 34 receives the victim signal and two inverted aggressor signals. The third AND circuit 34 outputs a high signal when the victim signal is at a high level and the aggressor signals are at a low level.

The fourth AND circuit 35 receives the two aggressor signals and an inverted victim signal. The fourth AND circuit 35 outputs a high signal when the victim signal is at a low level Low and the two aggressor signals are at a high level.

The outputs of the third AND circuit 34 and the fourth AND circuit 35 are input to the second OR circuit 37. The second OR circuit 37 outputs a high signal when at least one of the outputs of third AND circuit 34 and the fourth AND circuit 35 is at a high level. When the two aggressor signals are in anti-phase with the victim signal, the second OR circuit 37 detects the odd mode. The output of the second OR circuit 37 is supplied to the third flip-flop FF33, latched by the third flip-flop FF33, and output as the control signal CONODD.

The control signal generator 30 detects the phase relationship among each of the 3-bit parallel data signals, and generates the control signals CONEVEN, CONODD, and CONNONE based on the phase relationship.

Figure 14:
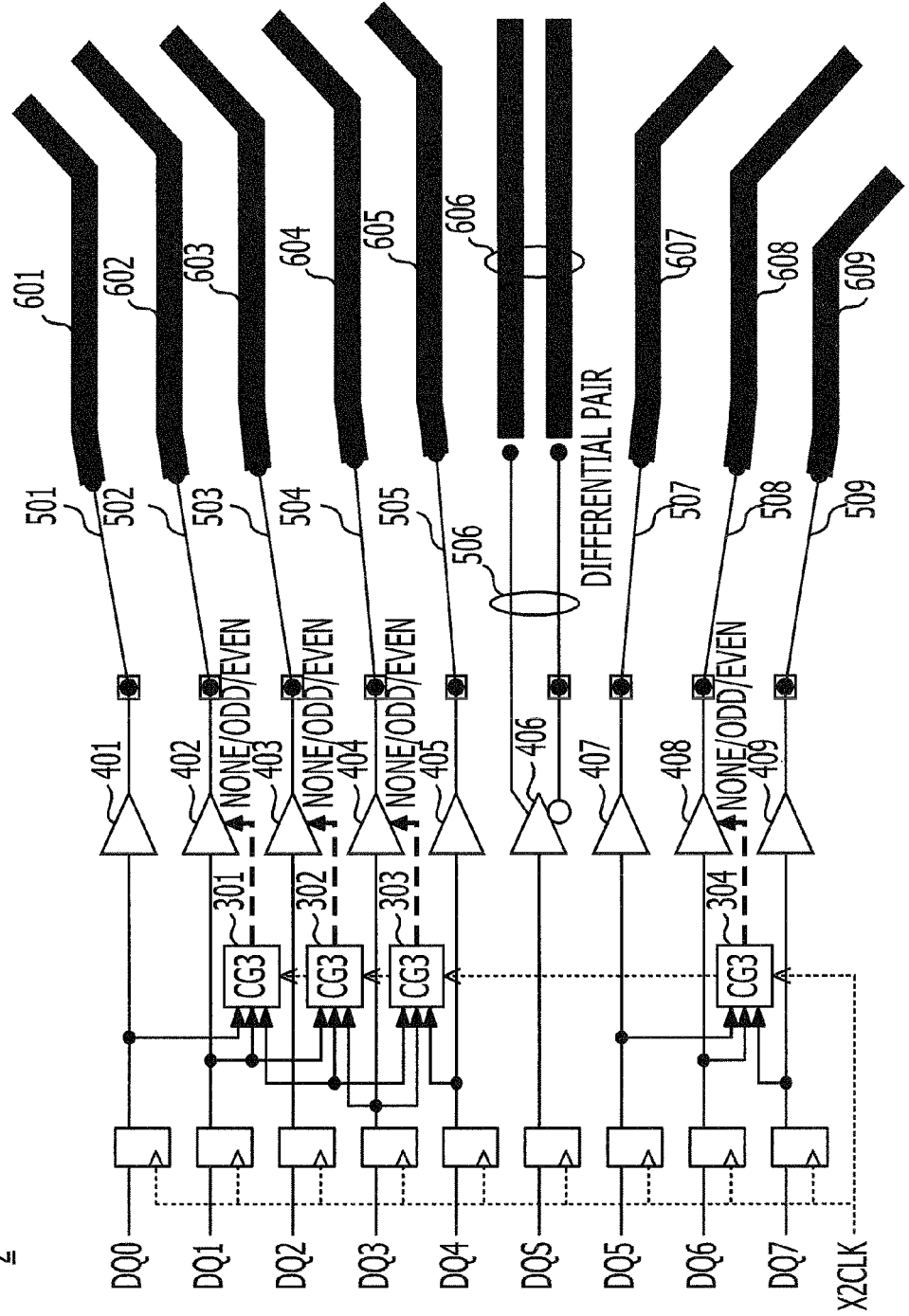
FIG. 14 illustrates an exemplary integrated circuit device.

FIG. 14 illustrates an exemplary integrated circuit device. The integrated circuit device illustrated in FIG. 14 may output 8-bit data. The integrated circuit device illustrated in FIG. 14 may also include the control signal generator 30 illustrated in FIG. 13.

The integrated circuit device 2 includes I/O cells 401 to 409 disposed for each transmission path that transmits one of the bit signals DQ0 to DQ7 of the 8-bit data, as well as the data strobe signal DQS. The respective outputs of the I/O cells 401 to 405 and 407 to 409 may be coupled to transmission paths on the printed circuit board via bonding wires 501 to 505 and 507 to 509, as well as interposers 601 to 605 and 607 to 609. The output of the I/O cell 406 that corresponds to the data strobe signal DQS is coupled to a corresponding transmission path on the printed circuit board via a differential pair bonding wire 506 and interposer 606.

The transmission paths may be indicated using the reference numbers of their transmitted signals DQ0 to DQ7 and DQS. In the integrated circuit device 2, the transmission paths are arranged in a parallel layout in the following order: DQ0 to DQ4, DQS, and DQ5 to DQ7.

The integrated circuit device 2 includes control signal generators 301 to 304 provided with respect to 3-bit parallel data signal transmission path groups DQ0 to DQ2, DQ1 to DQ3, DQ2 to DQ4, and DQ5 to DQ7. The first control signal generator 301 generates the control signals CONODD, CONEVEN, and CONNONE based on the phases among the bit signals DQ0, DQ1, and DQ2, and then supplies the generated control signals to the I/O cell 402 that corresponds to the bit signal DQ1, for example, the victim signal. The second, third, and fourth control signal generators 302 to 304 similarly generate control signals CONODD, CONEVEN, and CONNONE based on the phases among input bit signals, and supply the generated control signals to the corresponding I/O cells 403, 404, and 408. In response to the control signals CONODD, CONEVEN, and CONNONE supplied from one of the control signal generators 301 to 304, each of the I/O cells 402, 403, 404, and 408 adjusts the transistor gate widths.

Figure 15:
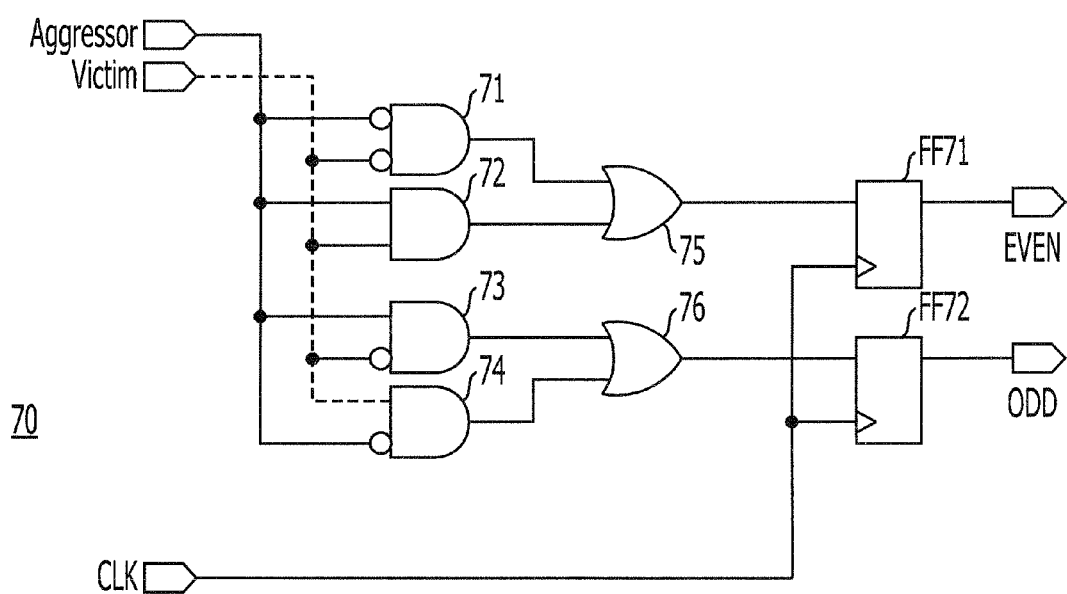
FIG. 15 illustrates an exemplary control signal generator.

FIG. 15 illustrates an exemplary control signal generator. The control signal generator 70 receives a victim signal and an aggressor signal as input. The control signal generator 70 includes first, second, third, and fourth AND circuits 71 to 74, first and second OR circuits 75 and 76, and flip-flops FF71 and FF72.

The first AND circuit 71 receives an inverted victim signal and an inverted aggressor signal as input. The first AND circuit 71 may also perform practically the same operation as a NOR circuit. The first AND circuit 71 outputs a high signal when the victim signal and the aggressor signal are at a low level.

The second AND signal 72 outputs a high signal when the victim signal and the aggressor signal are at a high level.

The outputs of the first AND circuit 71 and the second AND circuit 72 are input into the first OR circuit 75. The first OR circuit 75 outputs a high signal when at least one of the outputs of the first AND circuit 71 and the second AND circuit 72 is at a high level. When the aggressor signal is in phase with the victim signal, the first OR circuit 75 detects the even mode. The output of the first OR circuit 75 is supplied to the first flip-flop FF71, latched by the first flip-flop FF71, and output as the control signal CONEVEN.

The third AND circuit 73 receives the aggressor signal and an inverted victim signal as input. The third AND circuit 73 outputs a high signal when the aggressor signal is at a high level High and the victim signal is at a low level.

The fourth AND circuit 74 receives the victim signal and an inverted aggressor signal as input. The fourth AND circuit 74 outputs a high signal when the victim signal is at a high level and the aggressor signal is at a low level.

The outputs of the third AND circuit 73 and the fourth AND circuit 74 are input into the second OR circuit 76. The second OR circuit 76 outputs a high signal when at least one of the outputs of third AND circuit 73 and the fourth AND circuit 74 is at a high level. When the aggressor signal is in anti-phase with the victim signal, the second OR circuit 76 detects the odd mode. The output of the second OR circuit 76 is supplied to the second flip-flop FF72, latched by the second flip-flop FF72, and output as the control signal CONODD.

The control signal generator 70 thus detects the phase relationship between the bit signals of the 2-bit parallel data signals, and generates the control signals CONEVEN and CONODD based on the phase relationship.

An integrated circuit that outputs 8-bit data may also include six control signal generators 30.

Figure 16:
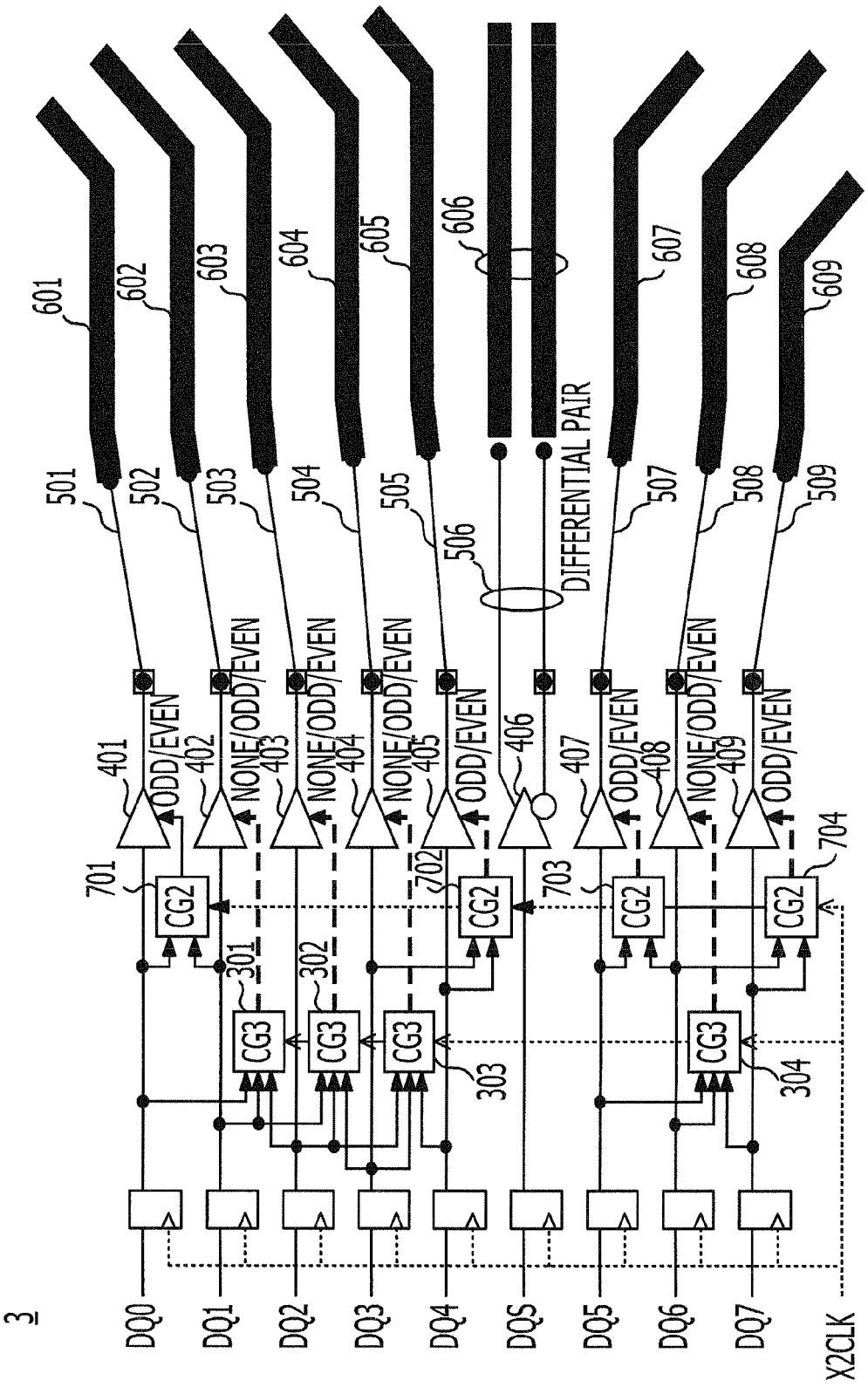
FIG. 16 illustrates an exemplary integrated circuit device.

FIG. 16 illustrates an exemplary integrated circuit device. The integrated circuit device 3 illustrated in FIG. 16 may output 8-bit data. The integrated circuit device 3 illustrated in FIG. 16 may also include the control signal generator 70 illustrated in FIG. 15. The integrated circuit device 3 includes fifth, sixth, seventh, and eighth control signal generators 701 to 704.

The control signal generators 701 to 704 may be provided at the edge boundaries DQ0, DQ4, DQ5, and DQ7 of the bit signal groups. The fifth control signal generator 701 generates the control signals CONODD and CONEVEN based on the phase between the bit signals DQ0 and DQ1, and then supplies the generated control signals to the I/O cell 401 that corresponds to the bit signal DQ0, for example, a victim signal. The sixth control signal generator 702 generates the control signals CONODD and CONEVEN based on the phase between the bit signals DQ3 and DQ4, and then supplies the generated control signals to the I/O cell 405 that corresponds to the bit signal DQ4, for example, a victim signal. The seventh control signal generator 703 generates the control signals CONODD and CONEVEN based on the phase between the bit signals DQ5 and DQ6, and then supplies the generated control signals to the I/O cell 407 that corresponds to the bit signal DQ5, for example, a victim signal. The eighth control signal generator 704 generates the control signals CONODD and CONEVEN based on the phase between the bit signals DQ6 and DQ7, and then supplies the generated control signals to the I/O cell 409 that corresponds to the bit signal DQ7, for example, the victim signal.

In response to the control signals CONODD, CONEVEN, and CONNONE supplied from the control signal generators 301 to 304 and 701 to 704, the I/O cells 401 to 405 and 407 to 409 adjust the transistor gate widths.

The integrated circuit device 3 that outputs 8-bit data as illustrated in FIG. 16 thus compensates for propagation delay, which is generated due to the effects of crosstalk, of the bit signals of 8-bit data.

The crosstalk-induced propagation delay may be compensated by modifying the widths of transistor gate in the I/O cells. The circuit that controls the driving performance of the I/O cells may compensate for the crosstalk-induced propagation delay.

Figure 17:
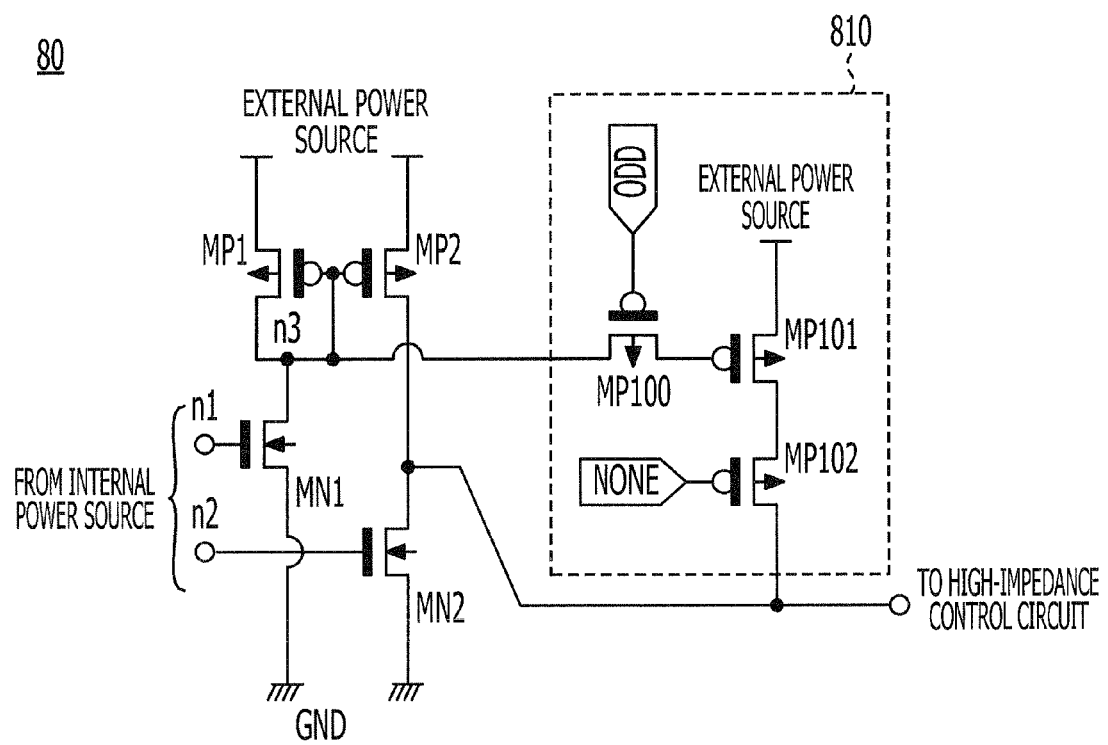
FIG. 17 illustrates an exemplary level converter.

FIG. 17 illustrates an exemplary level converter. The level converter illustrated in FIG. 17 may be provided in an I/O cell. The level converter 80 includes a drive controller circuit 810.

The drive controller circuit 810 is inserted in parallel with the second PMOS transistor MP2. In the even mode where the propagation delay is maximized, effects that are substantially the same as or similar to the effects where the gate width of the second PMOS transistor MP2 is widened. The drive controller circuit 810 includes a sixth PMOS transistor MP100, as well as seventh and eighth PMOS transistors MP101 and MP102, which are substantially the same PMOS transistors as the second PMOS transistor MP2.

The sixth PMOS transistor MP100 includes a source terminal coupled to the drain terminal of the first PMOS transistor MP1 in the level converter 80, and a drain terminal coupled to the gate terminal of the seventh PMOS transistor MP101. The sixth PMOS transistor MP100 includes a gate terminal coupled to the control signal CONODD supplied from a control signal generator. The sixth PMOS transistor MP100 is switched on when the control signal CONODD is at a low level.

The seventh PMOS transistor MP101 includes a source terminal coupled to an external power source, and a drain terminal coupled to the source terminal of the eighth PMOS transistor MP102. The seventh PMOS transistor MP101 is switched on when the input signal into the I/O cell is at a low level, and the control signal CONODD is at a low level.

The eighth PMOS transistor MP102 includes a drain terminal coupled to the drain terminal of the second PMOS transistor MP2 in the level converter 80, for example, the output of the level converter 80. The eighth PMOS transistor MP102 includes a gate terminal coupled to the control signal CONNONE supplied from a control signal generator. The eighth PMOS transistor MP102 is switched on when the control signal CONNONE is at a low level.

The drive controller circuit 810 operates when the controls signal CONODD is at a low level and the control signal CONNONE is at a low level. The drive controller circuit 810 is inserted in parallel with the second PMOS transistor MP2, and controls the second PMOS transistor MP2. When the transmission mode is in the even mode, the control signal CONODD is at a low level, while the control signal CONNONE is at a low level.

In a control signal generator corresponding to 2-bit parallel data signal transmission, the control signal CONODD may also be coupled to the gate terminal of the fifth PMOS transistor MP102.

Figure 18:
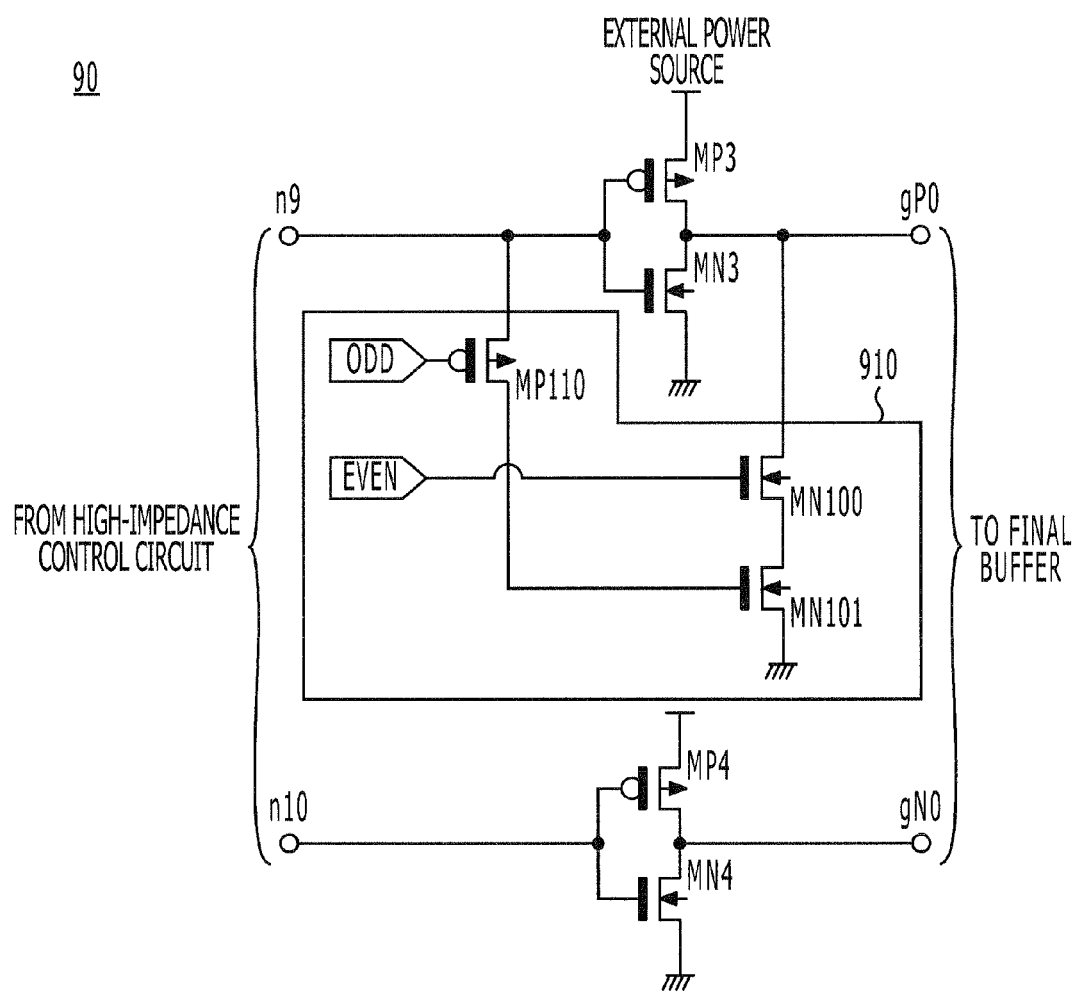
FIG. 18 illustrates an exemplary pre-buffer.

FIG. 18 illustrates an exemplary pre-buffer. The pre-buffer illustrated in FIG. 18 may be provided in an I/O cell. The pre-buffer 90 includes a drive controller circuit 910.

The drive controller circuit 910 is inserted in parallel with the third NMOS transistor MN3. In the even mode where the propagation delay is maximized, the third NMOS transistor MN3 is controlled. Effects are obtained that are substantially the same as or similar to the effects where the gate width of the third NMOS transistor MN3 is widened. The drive controller circuit 910 includes a ninth PMOS transistor MP110, as well as sixth and seventh NMOS transistors MN100 and MN101, which are substantially the same NMOS transistors as the third NMOS transistor MN3.

The ninth PMOS transistor MP110 includes a source terminal coupled to the gate terminals of both the third PMOS transistor MP3 and the third NMOS transistor MN3 in the pre-buffer 90, and a drain terminal coupled to the seventh NMOS transistor MN101. The ninth PMOS transistor MP110 includes a gate terminal coupled to the control signal CONODD supplied from a control signal generator. The ninth PMOS transistor MP110 is switched on when the control signal CONODD is at a low level.

The sixth NMOS transistor MN100 includes a drain terminal coupled between the third PMOS transistor MP3 and the third NMOS transistor MN3, and a source terminal coupled to the drain terminal of the seventh NMOS transistor MN101. The sixth NMOS transistor MN100 includes a gate terminal coupled to the control signal CONEVEN supplied from a control signal generator. The sixth NMOS transistor MN100 is switched on when the control signal CONEVEN is at a high level.

The seventh NMOS transistor MN101 includes a grounded source terminal. The seventh NMOS transistor MN101 is switched on when the control signal CONODD is at a low level and the gate potential of the third NMOS transistor MN3 is at a high level, for example, when the input signal into the I/O cell is at a low level.

The drive controller circuit 910 is inserted in parallel with the third NMOS transistor MN3. The drive controller circuit 910 operates when the control signal CONODD is at a low level, while the control signal CONEVEN is at a high level. The third NMOS transistor MN3 is controlled. In the even mode, the control signal CONODD is at a low level, and the control signal CONEVEN is at a high level.

By inserting circuits that control transistors in the I/O cells, the propagation delay may be compensated, and the eye pattern opening may be enlarged.

Figures 19A, 19B:
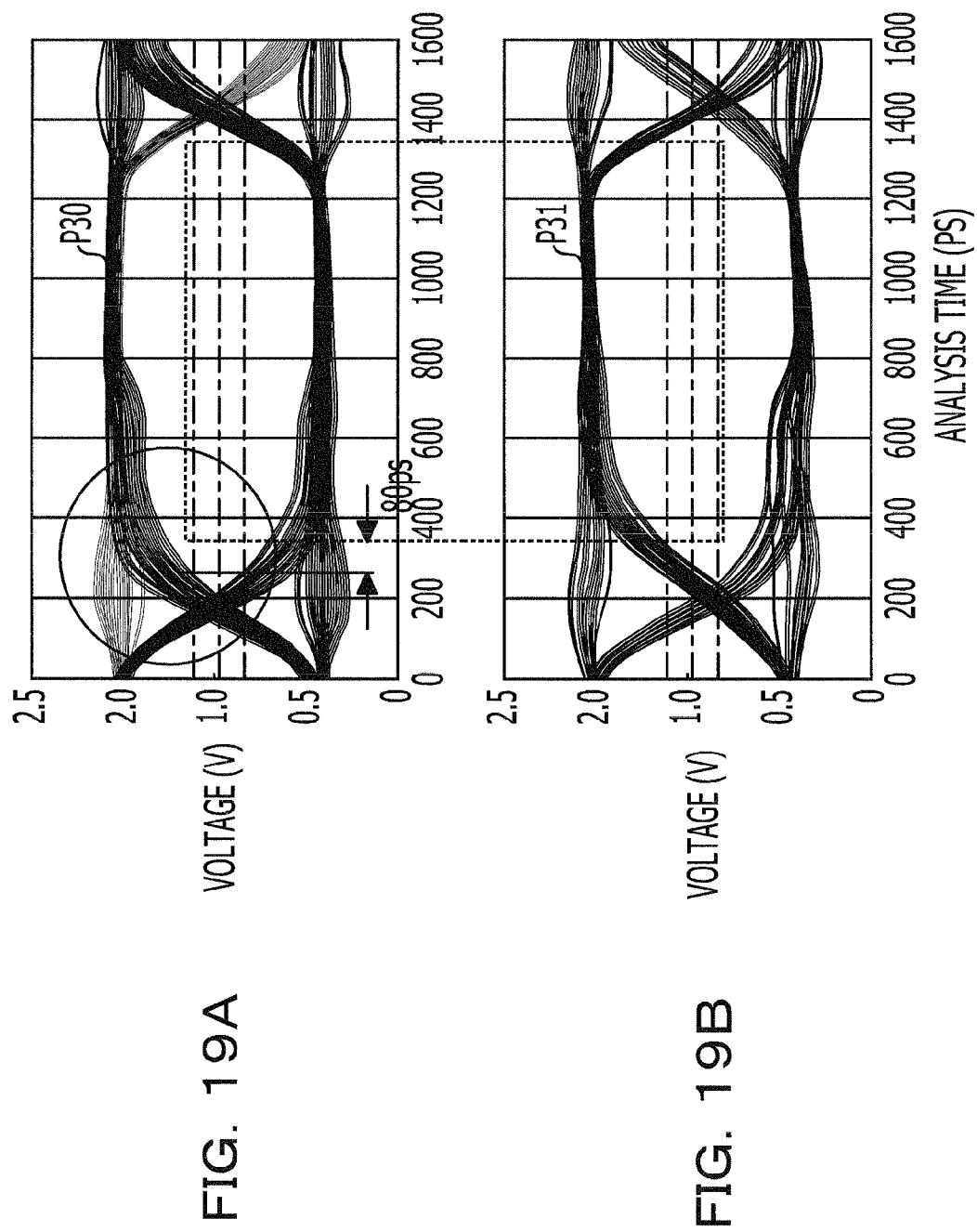
FIGS. 19A and 19B illustrate exemplary eye pattern waveforms.

FIGS. 19A and 19B illustrate exemplary eye pattern waveforms. The eye pattern waveforms illustrated in FIGS. 19A and 19B may be obtained by simulation.

The simulation may be conducted on parallel transmission paths transmitting the individual bit signals DQ0 to DQ4 of 5-bit parallel data. The control signal generator 30 illustrated in FIG. 13 may also be provided for each group of 3-bit parallel data DQ0 to DQ2, DQ1 to DQ3, and DQ2 to DQ4. The control signal generator 70 illustrated in FIG. 15 may also be provided at each bit boundary DQ0 and DQ4. The output of the I/O cells of the integrated circuit device may be coupled to a package, such as a bonding wire or interposer, to the transmission path of a printed circuit board, or to a load, such as a DRAM model.

The waveform P30 in FIG. 19A may be an eye pattern waveform for controlling the drive of an I/O cell based on the phase relationship among the parallel data signals. The waveform P31 in FIG. 19B may be another eye pattern waveform. On the side of the fast crosspoints of the eye pattern, such as on the setup side, the eye pattern width may extend to approximately 80 ps, and thus the setup margin may increase.

Figure 20:
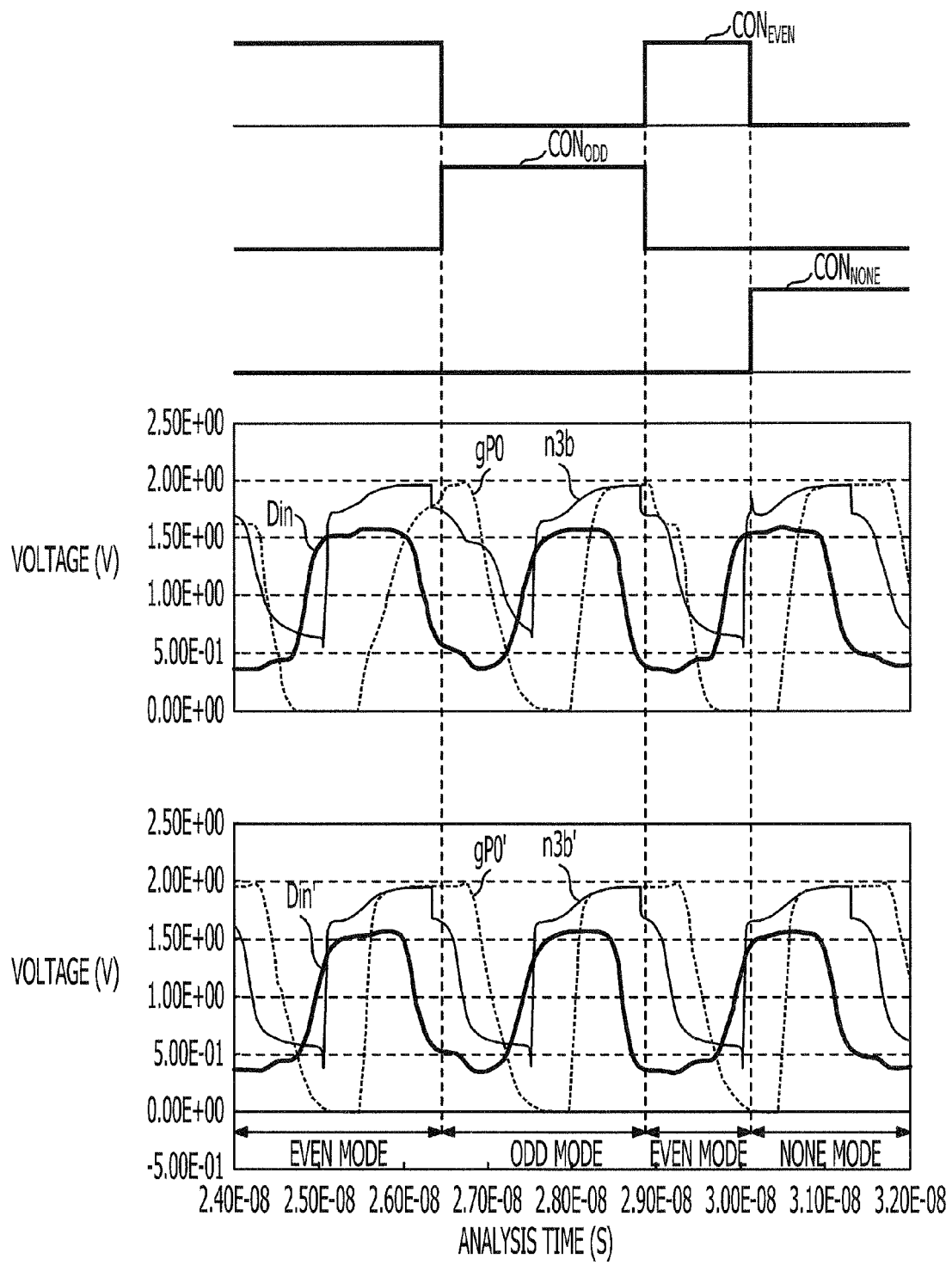
FIG. 20 illustrates exemplary waveforms of an I/O cell.

The width of the eye pattern may be extended by compensating for propagation delay FIG. 20 illustrates exemplary waveforms of an I/O cell. FIG. 20 illustrates the waveform of the output signal n3*b* of the level converter 80, and the first output waveform of the pre-buffer 90, such as the signal gP0 waveform retrieved from between the third PMOS transistor MP3 and the third NMOS transistor MN3. FIG. 20 illustrates the waveform of the signal Din output to a DRAM terminal through a bonding wire and an interposer in the package as well as the transmission path of the printed circuit board. FIG. 20 also illustrates the waveforms n3*b*', gP0', and Din' of another I/O cell 10. The respective control signals CONEVEN, CONODD, and CONNONE generated by a control signal generator are also illustrated.

Compared to the first output signal gP0' of the pre-buffer 14 illustrated in FIG. 9, the first output signal gP0 of the pre-buffer 90 illustrated in FIG. 18 rises later in the first even mode, and falls sooner in the following even mode. The on time of the fifth PMOS transistor MP5 of the downstream final buffer is short, and the output signal of the I/O cell may be quickly driven by the external power source. For this reason, the setup time in the first half of the eye pattern may be extended. The signal gP0 rises late, and the off time of the fifth PMOS transistor MP5 of the final buffer 25 is long. The output signal of the I/O cell falls late. Thus, the hold time in the latter half of the eye pattern may be extended.

The output signal n3*b* of the level converter 80 falls later in the odd mode. Since the signal n3*b* falls late and the hold time before the first cycle is increased, the opening of the eye pattern may be delayed.

The signal gP0 falls sooner due to the pre-buffer 90. The on time of the fifth PMOS transistor MP5 of the final buffer is shortened, and the eye pattern opening on the setup side may be extended. For this reason, the width of the eye pattern may be extended by control of the fifth PMOS transistor MP5 and the fifth NMOS transistor MN5 of the final buffer.

Figure 21:
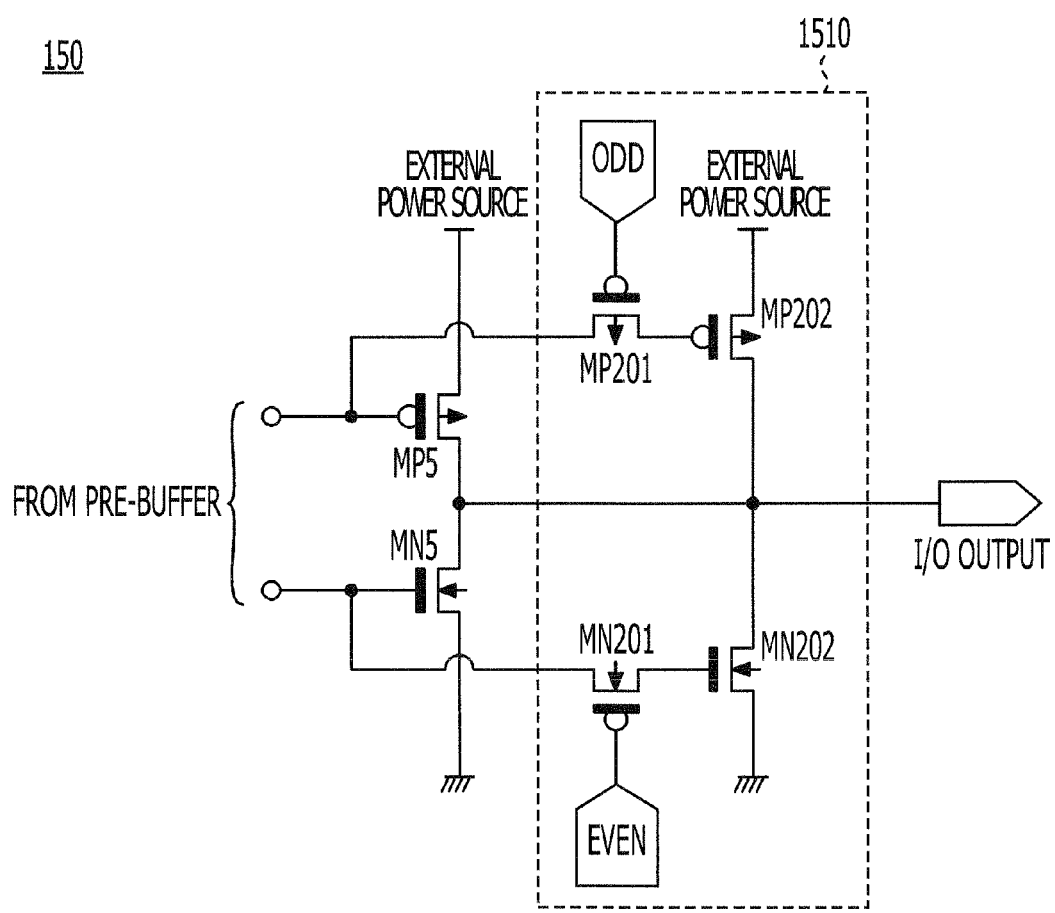
FIG. 21 illustrates an exemplary final buffer.

FIG. 21 illustrates an exemplary final buffer. The final buffer illustrated in FIG. 21 may be provided in an I/O cell. The final buffer 150 includes a drive controller circuit 1510.

The drive controller circuit 1510 is inserted in parallel with the fifth PMOS transistor MP5 and the fifth NMOS transistor MN5. In the even mode where the propagation delay is maximized, effects, which are substantially the same as or similar to the case where the fifth PMOS transistor MP5 and the fifth NMOS transistor MN5 are controlled and the transistor gate widths are widened, may be obtained. The drive controller circuit 1510 includes a 10th PMOS transistor MP201, as well as an 11th PMOS transistor MP202 that is substantially the same PMOS transistor as the fifth PMOS transistor MP5. The drive controller circuit 1510 also includes an eighth NMOS transistor MN201, as well as a ninth NMOS transistor MN202 that is substantially the same NMOS transistor as the fifth NMOS transistor MN5.

The 10th PMOS transistor MP201 includes a source terminal coupled to the gate terminal of the fifth PMOS transistor MP5 of the final buffer 150, and a drain terminal coupled to the gate terminal of the 11th PMOS transistor MP202. The 10th PMOS transistor MP201 also includes a gate terminal coupled to the control signal CONODD supplied from a control signal generator. The 10th PMOS transistor MP201 is switched on when CONODD is at a low level.

The 11th PMOS transistor MP202 includes a source terminal coupled to an external power source, and a drain terminal coupled between the fifth PMOS transistor MP5 and the fifth NMOS transistor MN5. The 11th PMOS transistor MP202 is switched on when the first output of the pre-buffer is at a low level and the control signal CONODD is at a low level The eighth NMOS transistor MN201 includes a drain terminal coupled to the gate terminal of the fifth NMOS transistor MN5 of the final buffer 150, and a source terminal coupled to the gate terminal of the ninth NMOS transistor MN202. The eighth NMOS transistor MN201 also includes a gate terminal coupled to the control signal CONEVEN supplied from a control signal generator. The eighth NMOS transistor MN201 is switched on when CONEVEN is at a high level.

The ninth NMOS transistor MN202 includes a drain terminal coupled between the fifth PMOS transistor MP5 and the fifth NMOS transistor MN5, and a grounded source terminal. The ninth NMOS transistor MN202 is switched on when the second output of the pre-buffer is at a high level and the control signal CONEVEN is at a high level.

For example, when the transmission mode is in the even mode and the signal input into the I/O cell is at a high level, the 10th and the 11th PMOS transistors MP201 and MP202 are switched on, and the output of the I/O cell is coupled to the external power source. The drive controller circuit 1510 controls the fifth PMOS transistor MP5, and causes the 11th PMOS transistor MP202 and the fifth PMOS transistor MP5 to be coupled in parallel. When the transmission mode is in the even mode and the signal input into the I/O cell is at a low level, the eighth and ninth NMOS transistors MN201 and MN202 are switched on, and the output of the I/O cell is grounded. The drive controller circuit 1510 controls the driving of the fifth NMOS transistor MN5, and causes the ninth NMOS transistor MN202 and the fifth NMOS transistor MN5 to be coupled in parallel.

The circuit that controls the driving of the I/O cell may be built into the level converter, the pre-buffer, or the final buffer.

In the pre-buffer 90 illustrated in FIG. 18, the drive controller circuit 910 controls the third NMOS transistor MN3. The eye pattern width may be widened by controlling the third PMOS transistor MP3.

Figure 22:
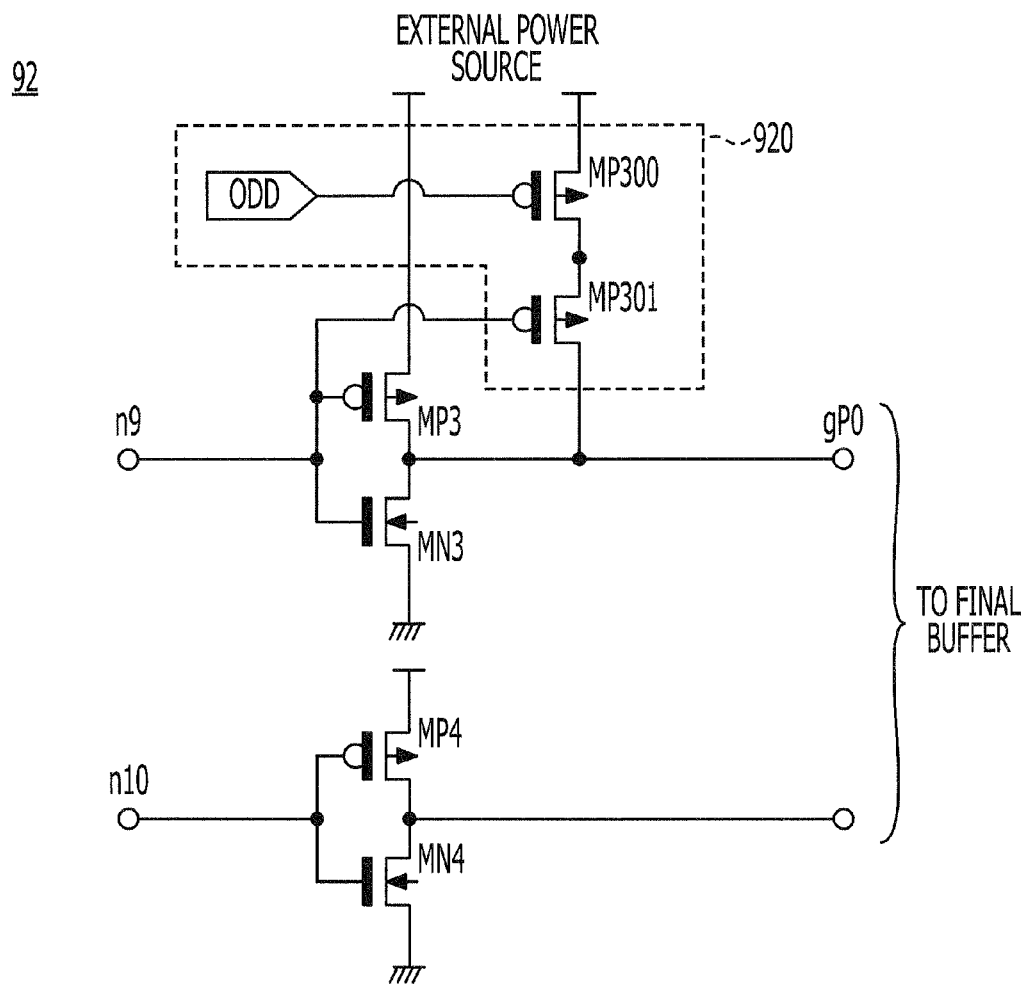
FIG. 22 illustrates an exemplary pre-buffer.

FIG. 22 illustrates an exemplary pre-buffer. The pre-buffer illustrated in FIG. 22 may be provided in an I/O cell. The pre-buffer 92 includes a drive controller circuit 920 that controls the third PMOS transistor MP3. The drive controller circuit 920 includes 12th and 13th PMOS transistors MP300 and MP301 that are substantially the same PMOS transistors as the third PMOS transistor MP3.

The 12th PMOS transistor MP300 includes a source terminal coupled to an external power source, and a drain terminal coupled to the source terminal of the 13th PMOS transistor MP301. The 12th PMOS transistor MP300 also includes a gate terminal coupled to the control signal CONODD supplied from a control signal generator. The 12th PMOS transistor MP300 is switched on when CONODD is at a low level.

The 13th PMOS transistor MP301 includes a drain terminal coupled to a connection point between the third PMOS transistor MP3 and the third NMOS transistor MN3, such as to the first output of the pre-buffer 92. The 13th PMOS transistor MP301 also includes a gate terminal coupled to the gate terminal of the third PMOS transistor MP3. The 13th PMOS transistor MP301 is switched on when the gate terminal of the third PMOS transistor MP3 is at a low level.

When the control signal CONODD is a low level, such as in the even mode, the drive controller circuit 920 operates when the signal input into the I/O cell is at a low level, and is coupled to the third PMOS transistor MP3 in parallel. The third PMOS transistor MP3 is thus controlled.

The number of elements in the drive controller circuit 920 may be reduced.

Figure 23A:
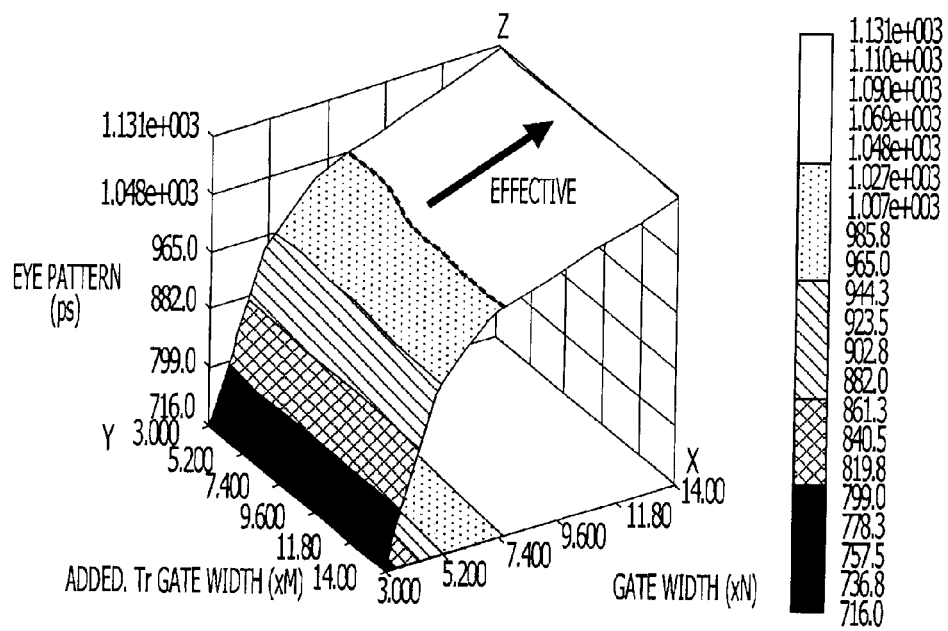
FIGS. 23A and 23B illustrate exemplary relationships between a transistor gate width and an eye pattern.
Figure 23B:
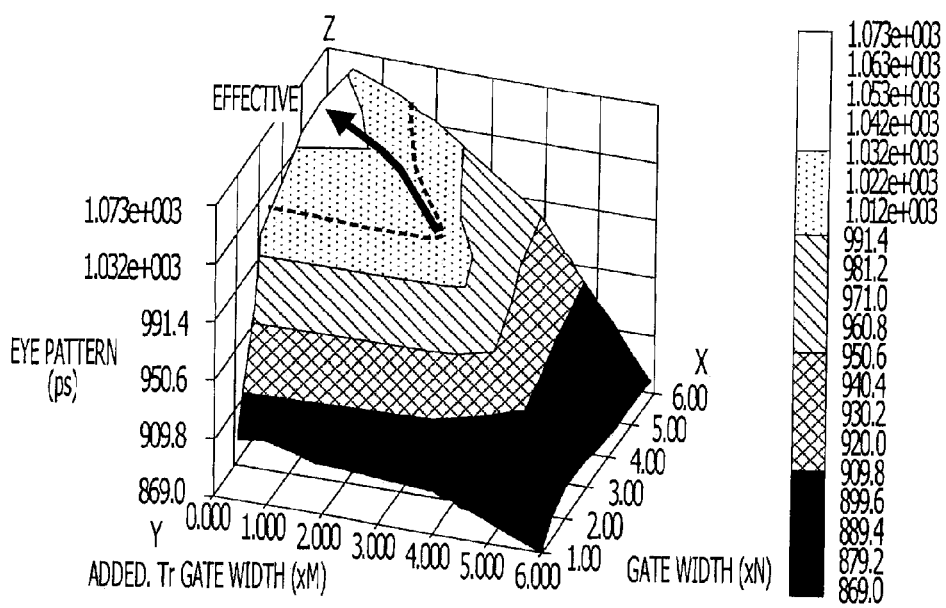

FIGS. 23A and 23B illustrate exemplary relationships between a transistor gate width and an eye pattern. FIG. 23A illustrates an increase in the width of the eye pattern due to the drive controller circuit 920. The X axis indicates a gate width ratio of the third PMOS transistor MP3 in the pre-buffer. The Y axis indicates a gate width ratio of a transistor in the drive controller circuit 920, such as MP300 or MP301. The gate width of MP300 and the gate width of MP301 may be substantially the same. The Z axis indicates the width of the eye pattern, such as the width from point A to point E illustrated in FIG. 5. FIG. 23B illustrates an increase in the width of the eye pattern due to the drive controller circuit 910. The X axis indicates a gate width ratio of the third NMOS transistor MN3 in the pre-buffer. The Y axis indicates a gate width ratio of a transistor in the drive controller circuit 910, such as MN100 or MN101. The gate width of MN100 and the gate width of MN101 may be substantially the same. The Z axis indicates the width of the eye pattern.

The parallel transmission paths are grouped into 3-bit or 2-bit units, and control signals are generated based on the phase relationship among locally adjacent signals. The driving of the I/O cell is controlled based on the control signals. In a transmission mode where propagation delay is produced due to the effects of crosstalk, such as in the even mode, the transmission data characteristics may be improved.

Figure 24:
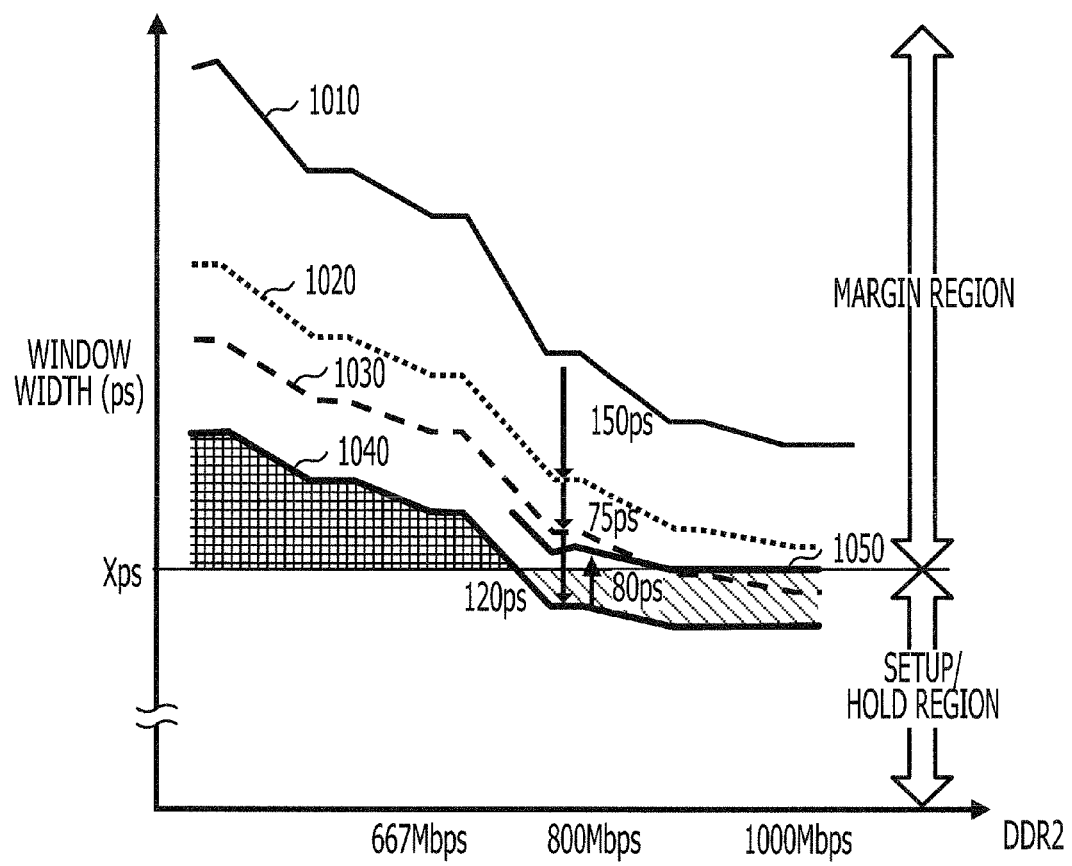
FIG. 24 illustrates an exemplary relationship between a data rate and a data window width.

The previous embodiment may be applied to a memory interface such as a DDR interface. FIG. 24 illustrates an exemplary relationship between a data rate and a data window width. The data rate and the data window width may be the data rate and the data window width of DDR2-SDRAM. The horizontal axis indicates the DDR2 data rate, while the vertical axis indicates the data window width (in units of picoseconds (ps)). The data window width may also correspond to the intervals between crosspoints in the eye pattern. The region where the window width is X ps or less represents the minimum setup/hold time. The region where the window width exceeds X ps represents the margin time.

The graph line 1010 illustrates the original window width of data output from the DDR interface. The graph line 1020 illustrates the data window width after a skew is produced based on internal fluctuations in the integrated circuit device. For example, in DDR2-800 Mbps, a skew of approximately 150 ps may be produced as a result of internal fluctuations in the integrated circuit device. The graph line 1030 illustrates the data window width after a skew is produced based on SSO noise effects on the graph line 1020. For example, in DDR2-800 Mbps, a skew of approximately 75 ps may be produced as a result of the effects of SSO noise. The graph line 1040 illustrates the data window width after a skew is produced based on package crosstalk effects on the graph line 1030. For example, in DDR2-800 Mbps, a skew of approximately 120 ps might be produced as a result of the effects of crosstalk in the package. The graph line 1040 illustrates the window width of data output to the terminal of DRAM coupled as the load. The data window width is reduced by 150+75+120=345 ps, and may fall below X ps.

The eye pattern may be extended by approximately 80 ps, as illustrated in FIG. 19, by the previous embodiment. The graph line 1050 illustrates the window width of data output to the DRAM terminal. Skews may be compensated, and the minimum setup/hold time may be ensured.

Example embodiments of the present invention have now been described in accordance with the above advantages. It will be appreciated that these examples are merely illustrative of the invention. Many variations and modifications will be apparent to those skilled in the art.

The invention claimed is:

1. An integrated circuit device, comprising:
a plurality of I/O cells coupled to an external apparatus;
a control signal generator configured to detect a phase relationship with a first data signal input to a first I/O cell, a second data signal provided on one side of the first data signal and input to a second I/O cell, and a third data signal provided on another side of the first data signal and input to a third I/O cell, the control signal generator being configured to generate control signals based on the phase relationship; and
a drive controller circuit configured to increase a driving performance of the first I/O cell based on the control signals.

2. The integrated circuit device according to claim 1, wherein the control signal generator includes:
a logic circuit that detects whether
the first data signal, the second data signal and the third data signal are in phase or anti-phase, and outputs the detection result as the control signals.

3. The integrated circuit device according to claim 2, wherein the control signals include:
a first level indicating that both of the third data signal and the second data signal are in phase with the first data signal; and
a second level indicating that both of the third data signal and the second data signal are in anti-phase with the first data signal.

4. The integrated circuit device according to claim 2, wherein the control signals include:
a third level indicating that one of the third data signal and the second data signal is in anti-phase with the first data signal.

5. The integrated circuit device according to claim 1, wherein the I/O cell includes:
a first pre-buffer that includes a first switching element configured to couple an output to a given terminal in response to an input signal;

a second pre-buffer that receives the output of the first pre-buffer; and
a first pre-buffer drive controller circuit disposed in parallel with the first switching element.

6. The integrated circuit device according to claim 5, wherein the first pre-buffer drive controller circuit includes:
a second switching element and a third switching element coupled in series between the output of the first pre-buffer and the given terminal; and
a fourth switching element disposed between a control terminal of the first switching element and a control terminal of the third switching element.

7. The integrated circuit device according to claim 6, wherein the first switching element, the second switching element, and the third switching element include an NMOS transistor, and the given terminal has a ground potential.

8. The integrated circuit device according to claim 5, wherein the first pre-buffer drive controller circuit includes a second switching element and a third switching element coupled in series between the output of the first pre-buffer and the given terminal.

9. The integrated circuit device according to claim 8, wherein the first switching element, the second switching element, and the third switching element include a PMOS transistor, and the given terminal has a power source voltage potential.

10. The integrated circuit device according to claim 1, wherein each I/O cell includes a level converter configured to amplify a first data signal,
wherein the level converter includes:
a first switching element configured to couple the output of the level converter to a given terminal in response to the first data signal; and
a level converter drive controller circuit disposed in parallel with the second switching element, and configured to operate when another data signal on a second transmission path adjacent to a first transmission path that transmits the first data signal is in phase with the data signal.

11. The integrated circuit device according to claim 10, wherein the level converter drive controller circuit includes:
second and third switching elements coupled in series between the given terminal and the output of the level converter; and
a fourth switching element disposed between a control terminal of the first switching element and a control terminal of the second switching element.

12. The integrated circuit device according to claim 11, wherein the first switching element, the second switching element, and the third switching element include a PMOS transistor, and the given terminal has a power source voltage potential.

13. The integrated circuit device according to claim 1, wherein the I/O cells include a negative logic circuit,
wherein the negative logic circuit includes:
a final buffer;
a first switching element disposed between a first terminal and the output of the final buffer; and
a second switching element disposed between a second terminal and the output of the final buffer; and
a final buffer drive controller circuit disposed in parallel with the third switching element or the second switching element, and configured to operate when a second data signal on a second transmission path adjacent to a first transmission path that transmits the first data signal is in phase with the data signal.

14. The integrated circuit device according to claim 13, wherein the final buffer drive controller circuit includes:
an third switching element disposed between the first terminal and the output of the negative logic circuit;
a fourth switching element disposed between a control terminal of the first switching element and a control terminal of the third switching element;
a fifth switching element disposed between the second terminal and the output of the negative logic circuit; and
a sixth switching element disposed between the control terminal of the second switching element and the control terminal of the fourth switching element.

15. The integrated circuit device according to claim 14, wherein the third switching element and the third switching element include a PMOS transistor,
the second switching element and the fifth switching element include a NMOS transistor, and
the first terminal has a power source voltage potential and the second terminal has a ground potential.

16. A data transmission system, comprising:
an integrated circuit device configured to include a plurality of I/O cells coupled to external apparatus; and
a printed circuit board on which are mounted the integrated circuit device, an external load, and transmission paths that transmit data signals between the integrated circuit device and the external load,
wherein the integrated circuit device includes:
a plurality of I/O cells coupled to an external apparatus;
a control signal generator configured to detect a phase relationship with a first data signal input to a first I/O cell, a second data signal provided on one side of the first data signal and input to a second I/O cell, and a third data signal provided on another side of the first data signal and input to a third I/O cell, the control signal generator being configured to generate control signals based on the phase relationship; and
a drive controller circuit configured to increase a driving performance of the first I/O cell based on the control signals.

17. The data transmission system according to claim 16, wherein the external load includes a DDR2-SDRAM.

* * * * *